US012687561B2

(12) United States Patent
Ito

(10) Patent No.: US 12,687,561 B2
(45) Date of Patent: Jul. 21, 2026

(54) INERTIAL SENSOR

(71) Applicant: SEIKO EPSON CORPORATION,
Tokyo (JP)

(72) Inventor: Fumiya Ito, Suwa (JP)

(73) Assignee: SEIKO EPSON CORPORATION,
Tokyo (JP)

( * ) Notice: Subject to any disclaimer, the term of this
patent is extended or adjusted under 35
U.S.C. 154(b) by 273 days.

(21) Appl. No.: 18/191,305

(22) Filed: Mar. 28, 2023

(65) Prior Publication Data

US 2023/0314462 A1 Oct. 5, 2023

(30) Foreign Application Priority Data

Mar. 30, 2022 (JP) ................................ 2022-055952

(51) Int. Cl.
*G01P 15/08* (2006.01)
*G01C 21/16* (2006.01)
*G01P 15/18* (2013.01)

(52) U.S. Cl.
CPC .......... *G01P 15/0802* (2013.01); *G01C 21/16*
(2013.01); *G01P 15/08* (2013.01); *G01P 15/18*
(2013.01); *B81B 2201/0235* (2013.01); *G01P*
*2015/0865* (2013.01)

(58) Field of Classification Search
CPC ...... G01P 15/0802; G01P 15/18; G01P 15/08;
G01C 21/16
See application file for complete search history.

(56) References Cited

U.S. PATENT DOCUMENTS

| | | | | |
|---|---|---|---|---|
| 6,201,284 B1 * | 3/2001 | Hirata | ..................... | G01P 15/18 |
| | | | | 257/415 |
| 6,263,734 B1 * | 7/2001 | Fujii | ................... | G01P 15/0922 |
| | | | | 73/514.34 |
| 7,933,729 B2 * | 4/2011 | Fukushima | ........... | A63F 13/211 |
| | | | | 702/92 |
| 2003/0024312 A1 * | 2/2003 | Babala | .................... | G01P 15/08 |
| | | | | 73/510 |
| 2004/0182157 A1 * | 9/2004 | Sakai | .................... | G01P 15/125 |
| | | | | 73/514.32 |
| 2008/0000295 A1 * | 1/2008 | Kitazaki | ................... | G01P 3/22 |
| | | | | 73/510 |
| 2008/0136627 A1 * | 6/2008 | Hayakawa | .............. | G01P 15/08 |
| | | | | 340/540 |

(Continued)

FOREIGN PATENT DOCUMENTS

JP 2015-10856 A 1/2015
JP 2017-173280 A 9/2017

*Primary Examiner* — Helen C Kwok
(74) *Attorney, Agent, or Firm* — Rankin, Hill & Clark
LLP

(57) ABSTRACT

An inertial sensor according to the embodiment includes a
first sensor, a first detection circuit, a second sensor, a second
detection circuit, and a range setting unit. The first sensor
detects a first physical quantity on a first axis. The first
detection circuit outputs first detection information based on
a first sensor signal from the first sensor. The second sensor
detects a second physical quantity on a second axis. The
second detection circuit outputs second detection informa-
tion based on a second sensor signal from the second sensor.
The range setting unit performs range setting processing of
setting a detection range of the first physical quantity in the
first detection circuit based on the first detection information
and the second detection information.

15 Claims, 11 Drawing Sheets

(56)         References Cited

U.S. PATENT DOCUMENTS

| | | | |
|---|---|---|---|
| 2008/0174444 A1* | 7/2008 | Noda | G01P 15/08 340/669 |
| 2010/0030471 A1* | 2/2010 | Watanabe | G01C 21/26 701/494 |
| 2011/0109330 A1* | 5/2011 | Ikuta | G01L 9/12 455/127.5 |
| 2013/0338915 A1* | 12/2013 | Mizuochi | G01C 25/005 701/500 |
| 2014/0229135 A1* | 8/2014 | Nomura | G01C 25/005 702/94 |
| 2016/0011254 A1* | 1/2016 | Maeda | G01R 31/2829 324/538 |
| 2018/0348252 A1* | 12/2018 | Murakoshi | A63B 53/00 |
| 2019/0129042 A1* | 5/2019 | Yanagisawa | B60G 17/019 |
| 2020/0033825 A1* | 1/2020 | Otani | G05B 19/0423 |
| 2020/0264210 A1* | 8/2020 | Dakshinamurthy | G01P 15/08 |
| 2020/0271535 A1* | 8/2020 | Sato | G01L 9/0073 |
| 2020/0406846 A1* | 12/2020 | Nakajima | H03M 1/1076 |
| 2021/0231703 A1* | 7/2021 | Nakajima | G01C 25/005 |
| 2022/0137081 A1* | 5/2022 | Otani | G01C 19/5776 73/497 |

* cited by examiner

FIG. 12

| | X-AXIS ANGULAR VELOCITY [deg/s] | Y-AXIS ANGULAR VELOCITY [deg/s] | Z-AXIS ANGULAR VELOCITY [deg/s] | X-AXIS ANGULAR VELOCITY RANGE SETTING THRESHOLD VALUE [deg/s] | Y-AXIS ANGULAR VELOCITY RANGE SETTING THRESHOLD VALUE [deg/s] | Z-AXIS ANGULAR VELOCITY RANGE SETTING THRESHOLD VALUE [deg/s] | X-AXIS ANGULAR VELOCITY RANGE [deg/s] | Y-AXIS ANGULAR VELOCITY RANGE [deg/s] | Z-AXIS ANGULAR VELOCITY RANGE [deg/s] | MAGNITUDE RELATIONSHIP OF RANGE SETTING |
|---|---|---|---|---|---|---|---|---|---|---|
| INITIAL STATE | ±5 | ±5 | ±1 | ±30/100 | ±30/100 | ±30/50 | ±200 | ±200 | ±100 | Z<X=Y |
| FIRST STATE | ±5 | ±5 | ±45 | ±30/75 | ±30/75 | ±30/50 | ±150 | ±150 | ±100 | Z<X=Y |
| SECOND STATE | ±5 | ±5 | ±55 | ±30/75 | ±30/75 | ±30/100 | ±150 | ±150 | ±200 | Z<X=Y |
| THIRD STATE | ±5 | ±45 | ±45 | ±30/75 | ±30/100 | ±30/50 | ±150 | ±200 | ±100 | Z<X<Y |
| FOURTH STATE | ±45 | ±5 | ±45 | ±30/100 | ±30/75 | ±30/50 | ±200 | ±150 | ±100 | Z<Y<X |

LEFT: FIRST THRESHOLD VALUE (50% OF RANGE)
RIGHT: SECOND THRESHOLD VALUE (50% OF RANGE)

*FIG. 13*

| | ROLL [deg] | PITCH [deg] | ROLL THRESHOLD VALUE [deg] | PITCH THRESHOLD VALUE [deg] | X-AXIS ANGULAR VELOCITY [deg/s] | Y-AXIS ANGULAR VELOCITY [deg/s] | X-AXIS ANGULAR VELOCITY RANGE SETTING THRESHOLD VALUE [deg/s] | Y-AXIS ANGULAR VELOCITY RANGE SETTING THRESHOLD VALUE [deg/s] | X-AXIS ANGULAR VELOCITY RANGE [deg/s] | Y-AXIS ANGULAR VELOCITY RANGE [deg/s] | MAGNITUDE RELATIONSHIP OF RANGE SETTING |
|---|---|---|---|---|---|---|---|---|---|---|---|
| INITIAL STATE | 0 | 0 | ±5 | ±5 | ±5 | ±5 | ±30/100 | ±30/100 | ±200 | ±200 | X=Y=Z |
| FIRST STATE | ±6 | ±6 | ±5 | ±5 | ±5 | ±5 | ±30/75 | ±30/75 | ±150 | ±150 | X=Y<Z |
| SECOND STATE | ±6 | ±6 | ±5 | ±5 | ±5 | ±5 | ±30/75 | ±30/50 | ±150 | ±100 | Y<X<Z |
| THIRD STATE | ±6 | ±6 | ±5 | ±5 | ±5 | ±45 | ±30/75 | ±30/100 | ±150 | ±200 | X<Y=Z |
| FOURTH STATE | ±6 | ±6 | ±5 | ±5 | ±45 | ±5 | ±30/100 | ±30/75 | ±200 | ±150 | Y<X=Z |

LEFT: FIRST THRESHOLD VALUE (50% OF RANGE)
RIGHT: SECOND THRESHOLD VALUE (50% OF RANGE)

INERTIAL SENSOR

The present application is based on, and claims priority from JP Application Serial Number 2022-055952, filed Mar. 30, 2022, the disclosure of which is hereby incorporated by reference herein in its entirety.

BACKGROUND

1. Technical Field

The present disclosure relates to an inertial sensor and the like.

2. Related Art

JP-A-2017-173280 discloses a method of changing a detection range of an inertial sensor. According to this method, a detection circuit of the inertial sensor changes the detection range by changing a voltage value per unit physical quantity based on an output signal passing through a filter unit.

According to the method disclosed in JP-A-2017-173280, a detection range of a certain physical quantity is set based on only the physical quantity. Therefore, detection accuracy of the inertial sensor depends on the detection accuracy itself of the inertial sensor, and it may be difficult to detect the physical quantity of the inertial sensor with high accuracy. Since the detection range of the physical quantity is set based on only the identified physical quantity in the inertial sensor, tracking of the inertial sensor may be delayed when the physical quantity is changed.

SUMMARY

An aspect of the present disclosure relates to an inertial sensor including: a first sensor configured to detect a first physical quantity on a first axis; a first detection circuit configured to perform detection processing of the first physical quantity based on a first sensor signal from the first sensor and output first detection information; a second sensor configured to detect a second physical quantity on a second axis; a second detection circuit configured to perform detection processing of the second physical quantity based on a second sensor signal from the second sensor and output second detection information; and a range setting unit configured to perform range setting processing. The range setting unit is configured to perform the range setting processing of setting a detection range of the first physical quantity in the first detection circuit based on the first detection information and the second detection information.

BRIEF DESCRIPTION OF THE DRAWINGS

FIG. 12 is a diagram showing an example of range adjustment when a fourth embodiment is applied.

FIG. 13 is a diagram showing an example of range adjustment when a fifth embodiment is applied.

DESCRIPTION OF EXEMPLARY EMBODIMENTS

Hereinafter, embodiments will be described. The embodiments to be described below do not unduly limit contents described in the claims. All configurations described in the embodiments are not necessarily essential constituent elements.

1. Inertial Sensor

Figure 1:
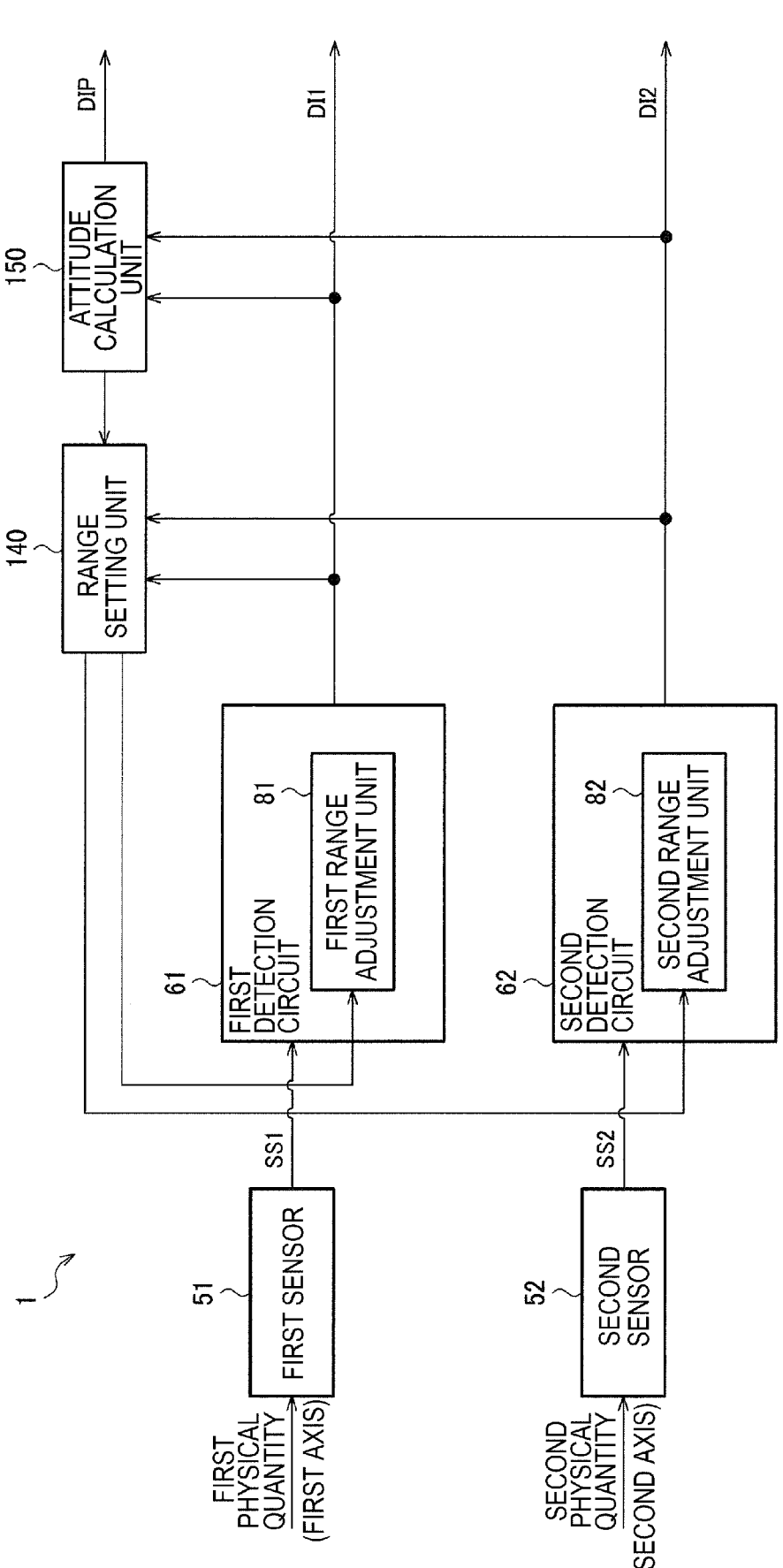
FIG. 1 is a configuration example of an inertial sensor according to an embodiment.
Figure 4:
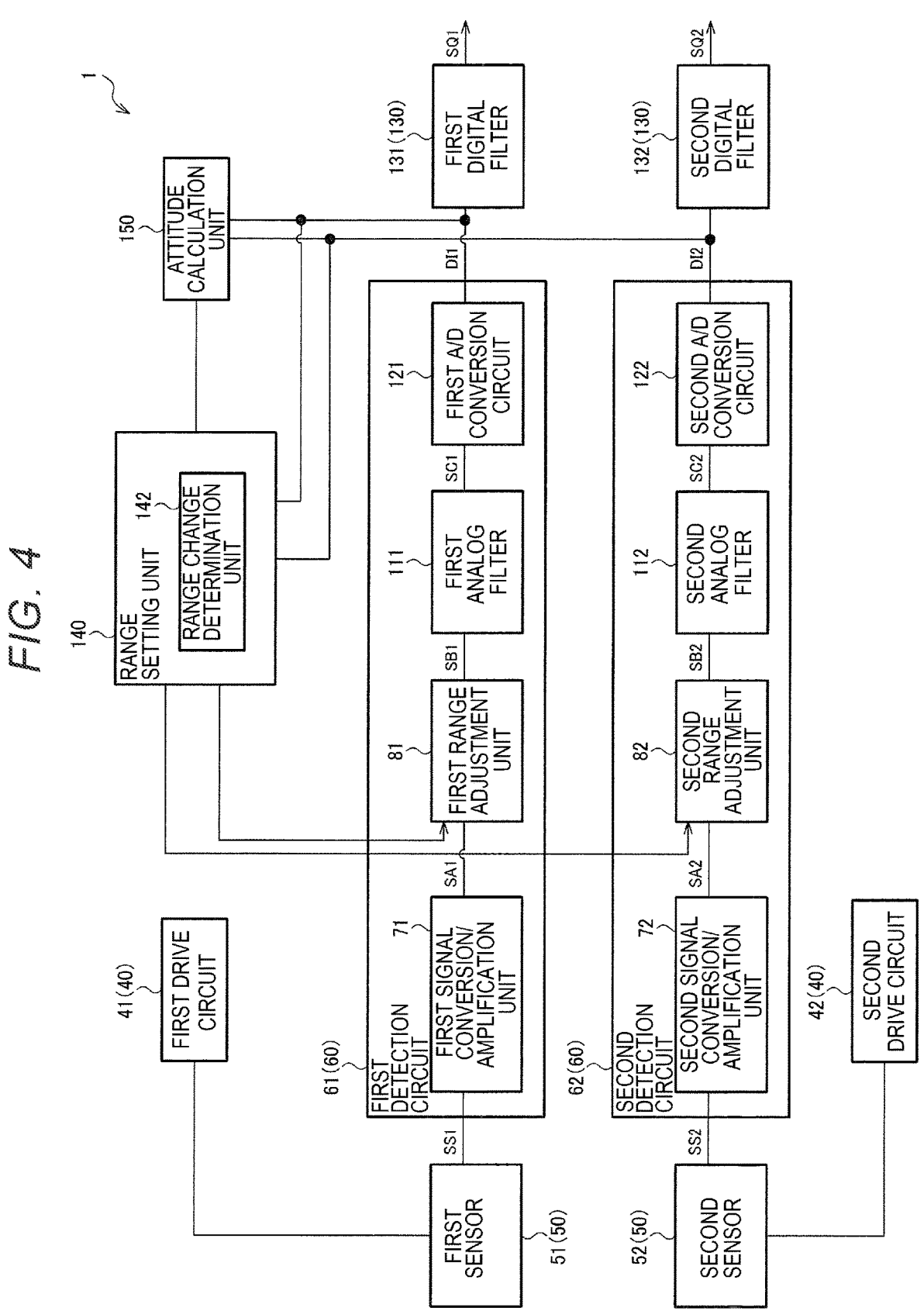
FIG. 4 is a diagram showing details of a configuration example of the inertial sensor according to the embodiment.
Figure 8:
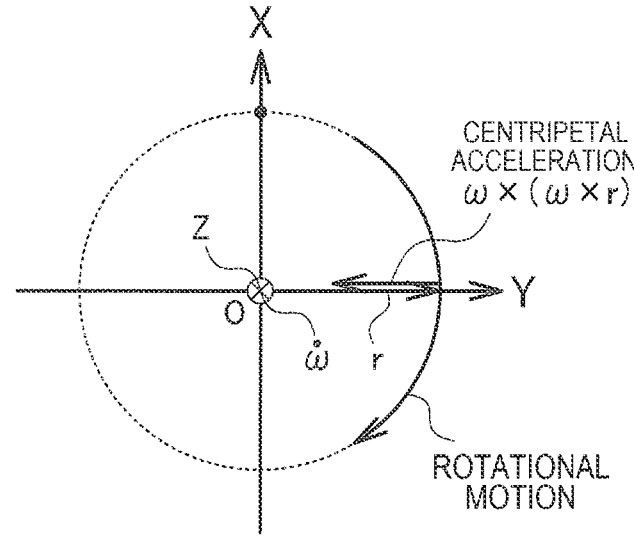
FIG. 8 is a diagram showing a centripetal acceleration.

An inertial sensor 1 according to the embodiment will be described with reference to FIG. 1. FIG. 1 is a diagram showing a configuration example of the inertial sensor 1. The inertial sensor 1 is implemented by, for example, a micro electro mechanical system (MEMS) device. In FIG. 1 and FIGS. 4 and 8 to be described later, all components are not shown for convenience of description. For example, an electrode wiring, an electrode terminal, and the like are omitted as appropriate. In the following, a case where a physical quantity detected by the inertial sensor 1 is an acceleration, an angular velocity, or an attitude will be described as an example, and the physical quantity is not limited thereto, and may be other physical quantities such as a displacement, a velocity, or a temporal change rate of an angular velocity. Then, a motion of a device equipped with the inertial sensor 1 in a three-dimensional space will be considered. The three-dimensional space is grasped using a first axis A1, a second axis A2, and a third axis A3 which are orthogonal to one another. The first axis A1, the second axis A2, and the third axis A3 are, for example, an X axis, a Y axis, and a Z axis. The X axis and the Y axis are axes parallel to an installation surface on which the inertial sensor 1 is to be installed. The Z axis is an installation surface on which the inertial sensor 1 is to be installed, that is, an axis in a direction orthogonal to an XY plane. The term "orthogonal" includes not only a case of crossing at 90° but also a case of crossing at an angle slightly inclined from 90°.

The inertial sensor 1 detects a physical quantity. The inertial sensor 1 is, for example, an element that detects a physical quantity such as a velocity, a displacement, and an angular velocity, and is implemented by, for example, a micro electro mechanical system (MEMS) device.

The inertial sensor 1 according to the embodiment detects the physical quantity as a first physical quantity PQ1 and a second physical quantity PQ2. The first physical quantity PQ1 is, for example, an acceleration, an angular velocity, or an attitude. The acceleration is an acceleration along each axis of the first axis A1, the second axis A2, and the third axis A3, and the angular velocity is an angular velocity along each axis of the first axis A1, the second axis A2, and the third axis A3. As will be described later with reference to FIG. 6, the attitude is a physical parameter for identifying the attitude, and is, for example, a physical quantity represented by Euler angles or quaternion. The second physical quantity PQ2 is a physical quantity other than the first physical quantity PQ1 among the above physical quantities. Further, as will be described later in "2. Second Embodiment", the inertial sensor 1 also detects the physical quantity as a third physical quantity PQ3. The third physical quantity PQ3 is a physical quantity other than the first physical quantity PQ1 and the second physical quantity PQ2 among the above physical quantities.

As shown in FIG. 1, the inertial sensor 1 according to the embodiment includes a first sensor 51, a second sensor 52, a first detection circuit 61, a second detection circuit 62, a range setting unit 140, and an attitude calculation unit 150.

Each of the first sensor S1 and the second sensor S2 is a sensor that detects a physical quantity. Specifically, the acceleration or the angular velocity is detected. Detection of the accelerations of the first axis A1, the second axis A2, and the third axis A3 is performed by, for example, an electrostatic capacitance type acceleration sensor, a frequency change type acceleration sensor, or a piezoresistive acceleration sensor. Detection of the angular velocities having the first axis A1, the second axis A2, and the third axis A3 as rotation axes can be performed by, for example, an electrostatic capacitance type angular velocity sensor, a frequency change type angular velocity sensor, or an optical fiber gyroscope.

The first detection circuit 61 performs, based on a first sensor signal SS1, which is detection information of the first sensor 51, processing such as amplification, range adjustment, filter processing, or A/D conversion of the first sensor signal SS1, and outputs a processed result as first detection information DI1. The second detection circuit 62 performs the same processing as that of the first sensor 51 based on a second sensor signal SS2, which is the detection information of the second sensor S2, and outputs a result as second detection information DI2. Regarding the first physical quantity PQ1, detection information output from the first detection circuit 61 is referred to as the first detection information DI1. Similarly, regarding the second physical quantity PQ2, detection information output from the second detection circuit 62 is referred to as the second detection information DI2.

A first range adjustment unit 81 of the first detection circuit 61 performs range adjustment in the first detection circuit 61. Specifically, the first range adjustment unit 81 changes a dynamic range. The dynamic range is a ratio between a minimum value and a maximum value of an identifiable signal, and is one of analog indices representing an information amount of a signal. Similarly, a second range adjustment unit 82 of the second detection circuit 62 also performs range adjustment in the second detection circuit 62. The range adjustment refers to adjusting a detection range of a physical quantity detected by the first detection circuit or the second detection circuit. That is, each of the first range adjustment unit 81 and the second range adjustment unit 82 performs the range adjustment so as to achieve an optimum range determined by the range setting unit 140. In the following description, the first range adjustment unit 81 and the second range adjustment unit 82 are collectively referred to as the range adjustment unit.

Figure 2:
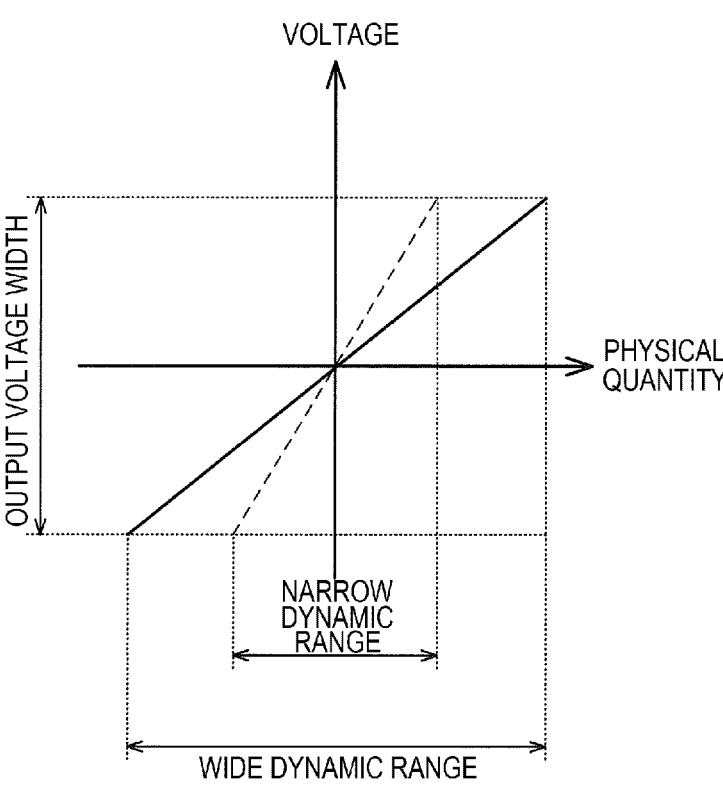
FIG. 2 is a diagram showing a relationship between an output voltage and a dynamic range.

FIG. 2 is a diagram showing a dynamic range. As shown in FIG. 2, the dynamic range of the physical quantity is narrowed when a slope of an output voltage with respect to the physical quantity is made steep in a constant output voltage width, and conversely, the dynamic range of the physical quantity is widened when the slope of the output voltage is made gentle. Here, the output voltage width corresponds to an output range of the physical quantity, and the slope of the output voltage corresponds to detection sensitivity. Therefore, the dynamic range of the physical quantity is widened when the sensitivity is made steep in a constant output range, and conversely, the dynamic range of the physical quantity is narrowed when the sensitivity is made gentle. In other words, the dynamic range is changed by changing a voltage value per unit physical quantity. In the following description, the dynamic range is appropriately referred to as a detection range. The adjustment of the dynamic range is simply referred to as the range adjustment.

Figure 3:
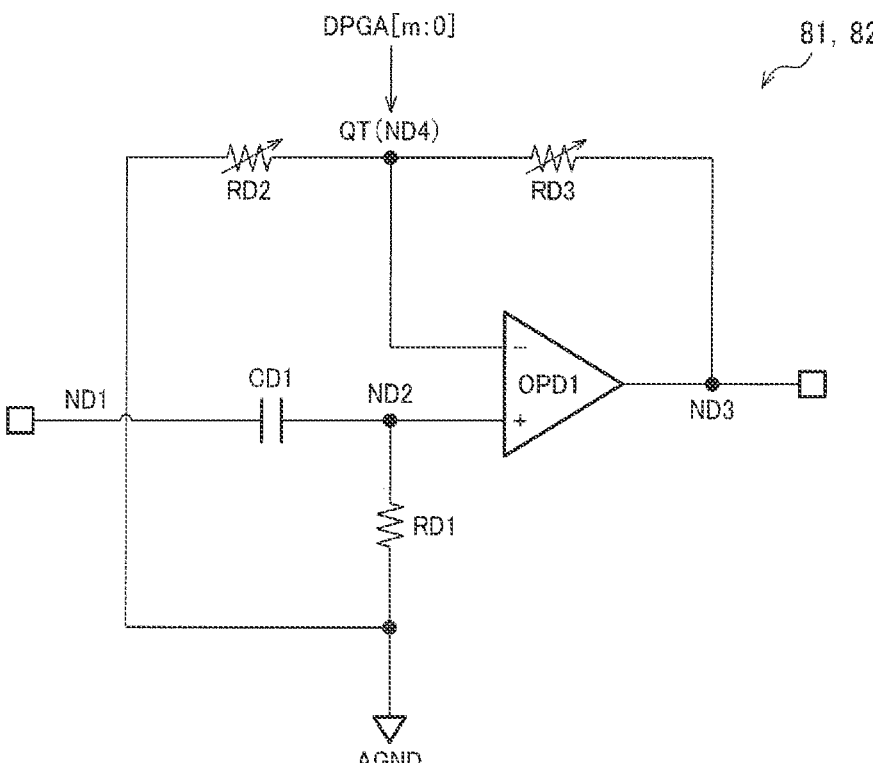
FIG. 3 is a circuit diagram showing an example of a range adjustment unit.

An example of the range adjustment unit is shown in FIG. 3. In FIG. 3, the range adjustment unit operates as a variable gain amplifier (not shown) and also operates as a high-pass filter. The high-pass filter and the variable gain amplifier, which are active filters, share an operational amplifier.

A non-inverting amplification type range adjustment unit shown in FIG. 3 includes an operational amplifier OPD1. A capacitor CD1 is provided between an input node ND1 and a node ND2, and a resistor RD1 is provided between the node ND2 and a node of a reference power supply voltage AGND. The reference power supply voltage AGND is, for example, a first power supply voltage.

The range adjustment unit includes variable resistors RD2 and RD3 provided between an output node ND3 and the node of AGND. The node ND2 is coupled to a non-inverting input terminal of the operational amplifier OPD1, and an output tap QT of the variable resistors RD2 and RD3 is coupled to an inverting input terminal of the operational amplifier OPD1. Here, the output tap QT is provided at a node ND4. Further, the output node ND3 is coupled to an output terminal of the operational amplifier OPD1.

In FIG. 3, a resistance value of the variable resistor RD3 between the output node ND3 and the node ND4 where the output tap QT is provided and a resistance value of the variable resistor RD2 between the node ND4 and the node of AGND are variably controlled based on sensitivity adjustment data DPGA [m:0]. Accordingly, a gain of the range adjustment unit (not shown) is adjusted, and the dynamic range is adjusted by sensitivity adjustment. For example, assuming that the resistance values of the variable resistors RD2 and RD3 are R2 and R3, the gain of the range adjustment unit, which is PGA, is G=(R2+R3)/R2. Specifically, a plurality of output taps are provided for the variable resistor, and the output tap QT corresponding to the adjustment data DPGA [m:0] is selected from the plurality of output taps, whereby the resistance values R2 and R3 of the variable resistors RD2 and RD3 are determined, and the gain G=(R2+R3)/R2 is determined.

The range setting unit 140 determines whether to perform the range adjustment. Specifically, the range setting unit 140 determines to set the detection range of the physical quantity in the first sensor 51 and the second sensor 52 to an optimum range, and outputs a determination result. Here, the determination is performed based on the first detection information DI1 and the second detection information DI2. Determination processing performed by the range setting unit 140 is referred to as range setting processing.

The attitude calculation unit 150 outputs information related to the attitude by calculation. The attitude is represented by, for example, Euler angles or quaternion. The attitude calculation unit 150 receives the first detection information DI1 of the first detection circuit 61 and the second detection information DI2 of the second detection circuit 62, generates attitude information DIP which is information related to the attitude such as the Euler angles based on the information, and outputs the attitude information DIP from the inertial sensor 1. The generation of the attitude information DIP can be obtained by calculation using an angular velocity based on, for example, Formula (10) to be described later. In addition, the attitude information can be generated in combination with attitude information that can be calculated based on an acceleration using an attitude calculation filter to which a complementary filter, a Kalman filter, or the like is applied. The attitude calculation unit 150 outputs the attitude information DIP to the range setting unit 140.

FIG. 4 shows a detailed configuration example of the inertial sensor 1 according to the embodiment. FIG. 4 shows a specific configuration example of the first detection circuit 61 and the second detection circuit 62. Hereinafter, configurations and operations of a first signal conversion/amplification unit 71, a first analog filter 111, a first A/D conversion circuit 121, a first digital filter 131, and a first drive circuit 41 of the first detection circuit 61 will be described. The configurations and operations of a second signal conversion/amplification unit 72, a second analog filter 112, a second A/D conversion circuit 122, a second digital filter 132, and a second drive circuit 42 of the second detection circuit 62 are the same, and thus detailed description thereof will be omitted.

The first signal conversion/amplification unit 71 receives the first sensor signal SS1 from the first sensor 51, and performs signal conversion processing and amplification processing of the signal. Taking an angular velocity sensor as an example, the amplification processing is processing of differentially amplifying a differential sensor signal from the angular velocity sensor. The signal conversion processing is processing of converting a charge signal from the angular velocity sensor into a voltage signal or processing of extracting an angular velocity signal, which is a desired signal, by synchronous detection based on a synchronous detection signal from a drive circuit. Taking an acceleration sensor as an example, the amplification processing is processing of differentially amplifying differential signals from two fixed electrodes. The signal conversion processing is processing of converting an electrostatic capacitance signal from the acceleration sensor into an acceleration signal.

The first analog filter 111 performs filter processing on a signal after range adjustment. Specifically, low-pass filter processing of removing a high-frequency component is performed. The first analog filter 111 is used as a pre-installed filter of the first A/D conversion circuit 121. The first analog filter 111 is, for example, a passive filter including a resistor and a capacitor.

The first A/D conversion circuit 121 A/D-converts an analog signal from the first analog filter 111 and outputs detection information of a digital signal. For example, the first A/D conversion circuit 121 outputs the first detection information DI1 which is a first digital signal. The second A/D conversion circuit 122 outputs the second detection information DI2, which is a second digital signal.

The range setting unit 140 is as described above. A range change determination unit 142 of the range setting unit 140 performs range setting processing based on the first detection information DI1, the second detection information DI2, and the attitude information. The attitude calculation unit 150 also performs attitude calculation processing based on the first detection information DI1 and the second detection information DI2. As an A/D conversion method of the A/D conversion circuit, various methods such as a successive approximation type and a delta sigma type can be adopted.

The first digital filter 131 performs digital filter processing on the first detection information DI1 which is a digital signal from the first A/D conversion circuit 121. The first digital filter 131 is implemented by various filters such as a filter for extracting a specific frequency component, such as an FIR filter or an IIR filter, and a filter for removing noise, such as a Kalman filter. Further, the first digital filter 131, which is a digital filter 130, outputs a first sensor output signal SQ1 to the outside of the inertial sensor 1. The first sensor output signal SQ1 is digital data representing a detection result of the sensor.

The first drive circuit 41 is a circuit that drives the first sensor 51. When the first sensor 51 is a vibrator, the drive circuit outputs a drive signal for vibrating the sensor. When the sensor is an angular velocity sensor, the drive circuit may include an amplifier circuit that amplifies a feedback signal from the sensor, a gain control circuit that performs automatic gain control, an output circuit that outputs a drive signal to the sensor, and the like. When the sensor is an acceleration sensor, the drive circuit may include an output circuit that outputs a drive signal to a movable electrode of the acceleration sensor. The drive circuit is not necessarily provided.

Figure 5:
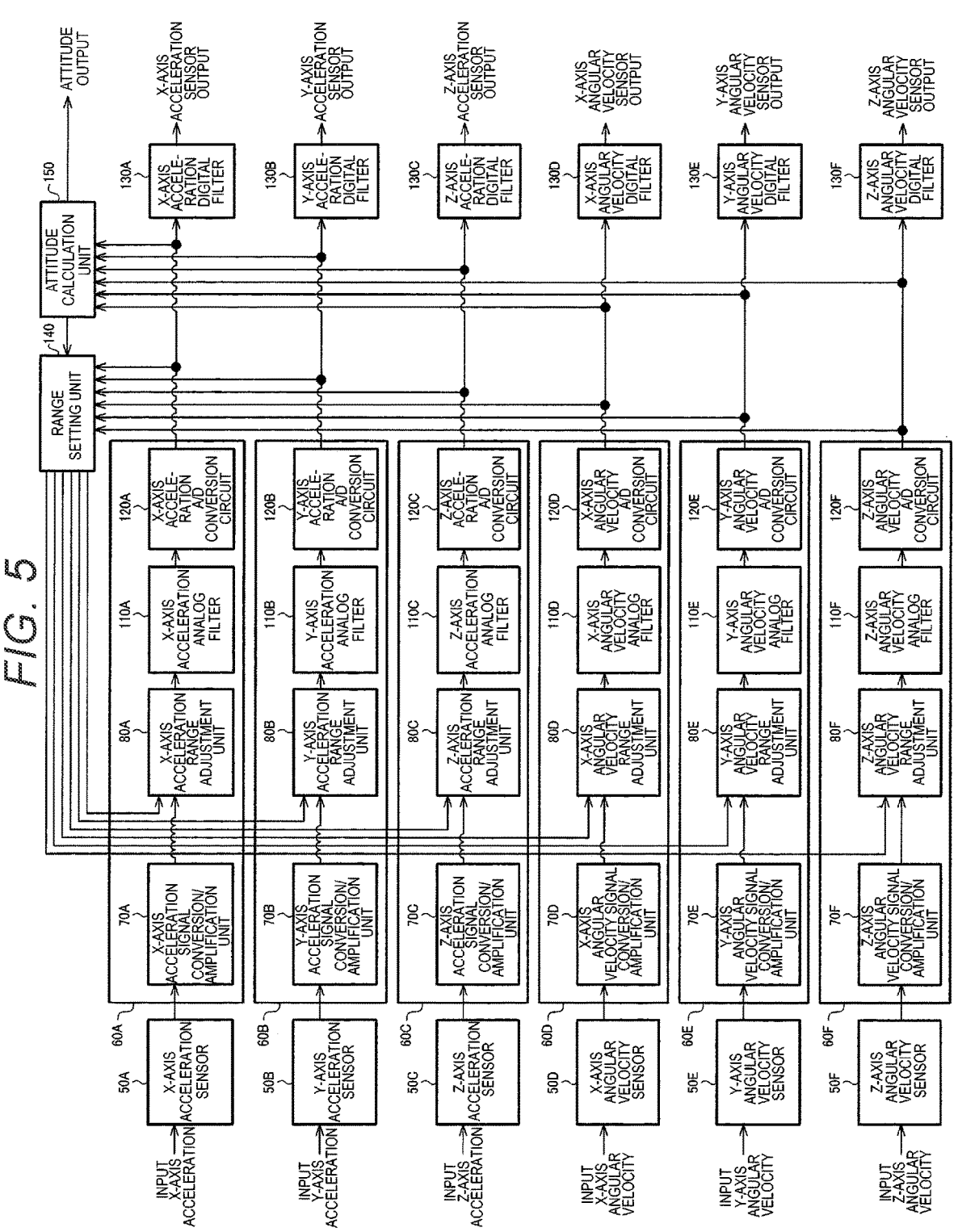
FIG. 5 is a specific configuration example of the inertial sensor according to the embodiment.

FIG. 5 shows a more detailed configuration example of the inertial sensor 1 according to the embodiment. FIG. 5 is a configuration example when the inertial sensor 1 according to the embodiment is applied to a six-axis motion sensor in which a triaxial acceleration sensor and a triaxial angular velocity sensor are combined.

In the example shown in FIG. 5, X-axis, Y-axis, and Z-axis acceleration sensors are mounted as the acceleration sensors, and X-axis, Y-axis, and Z-axis angular velocity sensors are mounted as the angular velocity sensors. Further, one of the X-axis, the Y-axis, the Z-axis acceleration sensor, the X-axis, the Y-axis, and the Z-axis angular velocity sensor corresponds to the first sensor 51 described with reference to FIGS. 1 and 4, and the other sensors correspond to the second sensor 52 described with reference to FIGS. 1 and 4.

Further, the same applies to signal conversion amplification units indicated by 70A to 70F, range adjustment units indicated by 80A to 80F, analog filters indicated by 110A to 110F, A/D conversion circuits indicated by 120A to 120F, and digital filter units indicated by 130A to 130F. For example, one of the signal conversion amplification units 70A to 70F corresponds to the first signal conversion/amplification unit 71 in FIG. 4, and another signal conversion amplification unit corresponds to the second signal conversion/amplification unit 72 in FIG. 4.

As described above, in the configuration example shown in FIG. 5, a sensor for detecting a large number of physical quantities is included, and accordingly, a large number of detection circuits for the physical quantities are provided. Then, it is possible to freely set which one of the circuits is designated as the first sensor 51 or the second sensor 52.

Next, a first embodiment according to the embodiment will be described with reference to FIG. 5. FIG. 5 is a circuit block diagram of the inertial sensor 1 according to the embodiment. As the inertial sensor 1, a six-axis motion sensor in which a triaxial acceleration sensor and a triaxial angular velocity sensor are combined is assumed.

First, a physical quantity such as an acceleration is applied to the inertial sensor 1 from the outside. A physical quantity detection sensor includes an X-axis acceleration sensor 50A, a Y-axis acceleration sensor 50B, and a Z-axis acceleration sensor 50C corresponding to physical quantities of an X-axis acceleration $Ax$, a Y-axis acceleration $Ay$, and a Z-axis acceleration $Az$. The physical quantity detection sensor includes an X-axis angular velocity sensor 50D, a Y-axis angular velocity sensor 50E, and a Z-axis angular velocity sensor 50F corresponding to physical quantities of an X-axis angular velocity $\omega x$, a Y-axis angular velocity $\omega y$, and a Z-axis angular velocity $\omega z$. The signal conversion/amplification unit, the range adjustment unit, the analog filter unit, the A/D conversion circuit, and the digital filter unit, which will be described later, also include six parts corresponding to the acceleration and the angular velocity of each axis.

Here, any one physical quantity of the X-axis acceleration Ax, the Y-axis acceleration Ay, the Z-axis acceleration Az, the X-axis angular velocity ωx, the Y-axis angular velocity ωy, and the Z-axis angular velocity ωz may be set as the first physical quantity PQ1, and other physical quantities may be set as the second physical quantity PQ2. For example, the first physical quantity PQ1 shown in FIGS. 1 and 2 may be set as the X-axis angular velocity ωx, and the second physical quantity PQ2 shown in FIGS. 1 and 2 may be set as the Z-axis angular velocity ωz. Here, the first physical quantity PQ1 and the second physical quantity PQ2 may be selected from the attitude information output by the attitude calculation unit 150. The attitude information is, for example, a physical parameter related to an attitude represented by Euler angles or quaternion.

Figure 6:
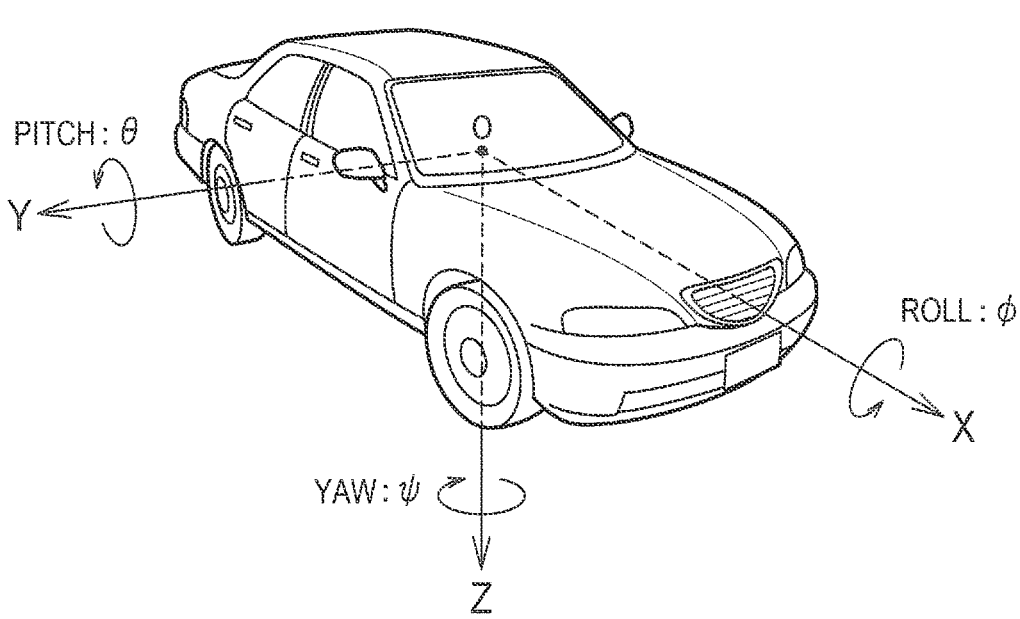
FIG. 6 is a diagram showing Euler angles.

FIG. 6 is a diagram showing Euler angles. The Euler angles identify a attitude of an object by three rotation angles of a roll angle φ, a pitch angle θ, and a yaw angle ψ as shown in FIG. 6. For example, when the X axis, the Y axis, and the Z axis which are orthogonal to one another are taken as shown in FIG. 6, the rotation angles around the respective axes correspond to the roll angle φ, the pitch angle θ, and the yaw angle ψ. As shown in FIG. 6, in a case where an automobile in which a center of gravity is positioned at an origin O is assumed, when a traveling direction of the automobile is taken as the X axis, the rotation angle with the X axis along the traveling direction as the rotation axis is the roll angle φ, and the rotation angle with the Y axis orthogonal to the traveling direction as the rotation axis is the pitch angle θ. The roll angle φ and the pitch angle θ change mainly due to factors such as unevenness and inclination of a road surface. Further, the rotation angle with the Z axis perpendicular to a plane on which the automobile travels as the rotation axis is the yaw angle ψ. The yaw angle ψ changes mainly due to factors such as a right turn or a left turn of the automobile. That is, the first physical quantity PQ1 or the second physical quantity PQ2 can be selected from the attitude information of the roll angle φ, the pitch angle θ, or the yaw angle ψ.

Among elements included in the physical quantity detection sensor, a detection element corresponding to the physical quantity which is the first physical quantity PQ1 is the first sensor S1. Similarly, a detection element corresponding to the physical quantity which is the second physical quantity PQ2 is the second sensor S2. Hereinafter, the X-axis acceleration Ax, the Y-axis acceleration Ay, and the Z-axis acceleration Az are collectively referred to as an acceleration A, and the X-axis angular velocity ωx, the Y-axis angular velocity ωy, and the Z-axis angular velocity ωz are collectively referred to as an angular velocity ω, as appropriate.

Further, a sensor signal from the X-axis acceleration sensor 50A is input to the detection circuit 60A. Here, in the detection circuit 60A, the sensor signal is input to the X-axis acceleration signal conversion/amplification unit 70A. In this case, the detection circuit 60A corresponds to the first detection circuit 61, and the sensor signal from the X-axis acceleration sensor 50A corresponds to the first sensor signal SS1. Further, the first detection circuit 61 in this case includes the X-axis angular velocity signal conversion/amplification unit 70D, the X-axis angular velocity range adjustment unit 80D, the X-axis angular velocity analog filter unit 110D, and the X-axis angular velocity A/D conversion circuit 120D. The first detection circuit 61 performs detection processing on the X-axis acceleration Ax, which is the first physical quantity PQ1, based on the first sensor signal SS1.

First, in the case shown in FIG. 5, the first sensor signal SS1 is input to the X-axis acceleration signal conversion/amplification unit 70A. That is, the first sensor signal SS1 corresponding to the X-axis acceleration Ax is input to the X-axis acceleration signal conversion/amplification unit 70A, and the conversion and amplification of the electrical signal are performed.

Thereafter, the range adjustment of the physical quantity is performed in the range adjustment unit. For example, when the first sensor signal SS1 of the X-axis acceleration Ax corresponding to the first physical quantity PQ1 is input, the range adjustment unit performs the range adjustment of the X-axis acceleration Ax based on the signal by the X-axis acceleration range adjustment unit 80A of the first detection circuit 61.

Here, the X-axis acceleration range adjustment unit 80A can also perform the range adjustment based on a physical quantity other than the X-axis acceleration Ax, which is the first physical quantity PQ1. Specifically, for a detection result of the X-axis angular velocity ωx as the second physical quantity PQ2, a result of the calculation processing executed by the range setting unit 140 is fed back, and is input to the X-axis acceleration range adjustment unit 80A corresponding to the first detection circuit 61. That is, the X-axis acceleration range adjustment unit 80A of the first detection circuit 61 can perform the range adjustment of the first physical quantity PQ1 using not only the X-axis acceleration Ax of the first physical quantity PQ1 but also the information on the X-axis angular velocity ωx of the second physical quantity PQ2.

Thereafter, the X-axis acceleration analog filter unit 110A performs the filter processing on a sensor signal output from the X-axis acceleration range adjustment unit 80A. Specifically, as described above, the low-pass filter processing of removing the high-frequency component is performed. Further, the X-axis acceleration A/D conversion circuit 120A converts an analog signal from the X-axis acceleration analog filter unit 110A into a digital signal. The digital output signal is output from the first detection circuit 61 as the first detection information DI1.

In this way, the first detection circuit 61 performs processing such as signal conversion, amplification, filter processing, analog-to-digital conversion, and the like in order to detect the first physical quantity PQ1. Then, the second detection circuit 62 similarly performs processing for detecting the second physical quantity PQ2. These processings are collectively referred to as detection processing. The first physical quantity PQ1 and the second physical quantity PQ2 are described above as an example, and the same applies to a third physical quantity PQ3 described in "2. Second Embodiment".

The first detection information DI1 of the first detection circuit 61 is input to the digital filter 130A, the attitude calculation unit 150, and the range setting unit 140. Each of the digital filters 130A to 130F performs processing of reducing noise or the like included in the electrical signal, and outputs an acceleration or an angular velocity corresponding to each of the digital filters 130A to 130F as an output result of the inertial sensor 1. The attitude calculation unit 150 receives the first detection information DI1 and the second detection information DI2 and calculates the attitude. As described with reference to FIG. 1, the attitude is represented by, for example, Euler angles or quaternion. The Euler angles identify the attitude by three angles thereof, that is, the roll angle φ, the pitch angle θ, and the yaw angle ψ. Information for identifying such an attitude is obtained by integrating, for example, the X-axis angular velocity ωx, the Y-axis angular velocity ωy, and the Z-axis angular velocity ωz included in the output signals of the first sensor 51 and the second sensor 52 with respect to time. The attitude calculation unit 150 outputs a calculation result as output information regarding the attitude of the inertial sensor 1. The attitude calculation unit 150 also outputs the output information regarding the attitude to the range setting unit 140.

As described above, the range setting unit 140 determines whether to perform the range adjustment of the inertial sensor 1 based on the output results of the attitude calculation unit 150, the first sensor 51, and the second sensor 52. Here, the range setting unit 140 may be inside an IC of the inertial sensor 1, or may be incorporated in, for example, software outside the inertial sensor 1. That is, in the embodiment, the physical quantity to be detected is predicted using the angular velocity, the acceleration, and the attitude information obtained from the inertial sensor 1, and the dynamic range is set to an appropriate range. As a method using the information, various methods are assumed. Therefore, an acceleration sensor and a gyro sensor do not need to be integrated as a unit, and the triaxial acceleration and the triaxial angular velocity are not essential components. For example, in the configuration of the triaxial acceleration sensor and the uniaxial gyro sensor, the triaxial acceleration and the uniaxial angular velocity may be used for the range change determination of the uniaxial gyro sensor.

In the example shown in FIG. 5, the first physical quantity PQ1 is the X-axis acceleration Ax, and the second physical quantity PQ2 is the X-axis angular velocity ωx. The first physical quantity PQ1 and the second physical quantity PQ2 can be freely designated as long as the first physical quantity PQ1 and the second physical quantity PQ2 are different physical quantities.

Next, a relationship between the acceleration and the angular velocity will be discussed. A motion of a rigid body includes a translational motion and a rotational motion, and the inertial sensor 1 detects an acceleration or an angular velocity associated with the motions. Based on these pieces of information, the Euler angles identifying the attitude are also detected. That is, an acceleration Ain applied to the inertial sensor 1 from the outside is represented by Formula (1).

$$A_{in} = A + g \qquad (1)$$

In Formula (1), A in the first term is a dynamic acceleration, and specifically, the acceleration includes a translational motion acceleration and an acceleration associated with rotational motion. g in the second term is a static acceleration, and a gravitational acceleration corresponds to the static acceleration. A in the first term can be further classified into the translational motion acceleration and the acceleration associated with rotational motion, and is represented as in Formula (2).

$$A = a + \omega \times (\omega \times r) + \dot{\omega} \times r + 2\omega \times \dot{r} \qquad (2)$$

In Formula (2), the first term is the translational motion acceleration. Further, the second term, the third term, and the fourth term are the accelerations associated with rotational motion described above. Specifically, the second term is an acceleration called a centripetal acceleration, and shows a behavior proportional to a square of the angular velocity. The third term is an acceleration called a tangential acceleration or the Euler acceleration, and shows a behavior proportional to a differentiation of the angular velocity. Further, the fourth term is an acceleration corresponding to a Coriolis force, and shows a behavior proportional to the angular velocity. Among such accelerations associated with rotational motion, in particular, the centripetal acceleration in the second term and the tangential acceleration in the third term appear remarkably when there is a rapid change in angular velocity.

Figure 7:
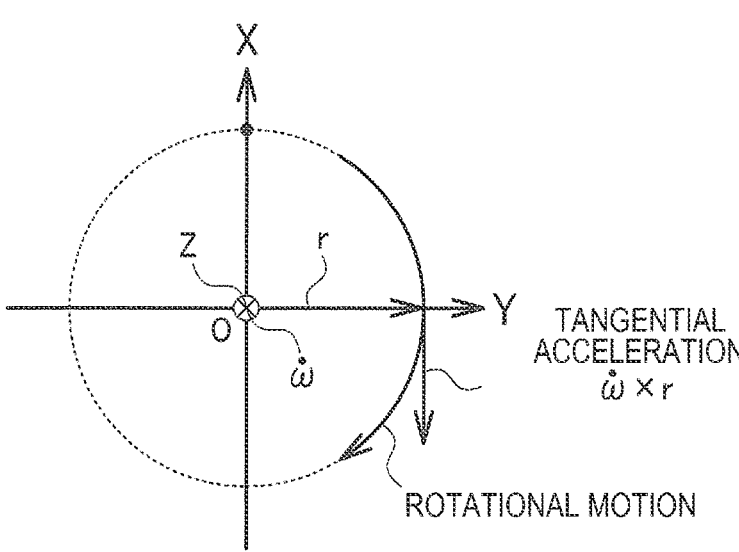
FIG. 7 is a diagram showing a tangential acceleration.

FIG. 7 is a diagram showing the tangential acceleration. FIG. 8 is a diagram showing the centripetal acceleration. First, the tangential acceleration will be specifically discussed with reference to FIG. 7. In general, when a rigid body located at a position vector r=(rx, ry, rz) from an origin O is performing the rotational motion, a tangential acceleration received by the rigid body is represented by Formula (3) using a time differentiation of an angular velocity vector ω.

$$\dot{\omega} \times r = \begin{pmatrix} 0 & -\dot{\omega}_z & \dot{\omega}_y \\ \dot{\omega}_z & 0 & -\dot{\omega}_x \\ -\dot{\omega}_y & \dot{\omega}_x & 0 \end{pmatrix} \begin{pmatrix} r_x \\ r_y \\ r_z \end{pmatrix} \qquad (3)$$

$$= \begin{pmatrix} -\dot{\omega}_z r_y + \dot{\omega}_y r_z \\ \dot{\omega}_z r_x - \dot{\omega}_x r_z \\ -\dot{\omega}_y r_x + \dot{\omega}_x r_y \end{pmatrix}$$

Therefore, as shown in FIG. 7, for example, when the position vector r from the origin O is represented by Formula (4) indicating a +Y direction and the angular velocity vector w is represented by Formula (5) indicating a +Z direction, the tangential acceleration is obtained by Formula (6) using a matrix corresponding to an outer product of the time differentiation of the angular velocity vector ω and the position vector r.

$$r = \begin{pmatrix} 0 \\ r_y \\ 0 \end{pmatrix} \qquad (4)$$

$$\omega = \begin{pmatrix} 0 \\ 0 \\ \omega_z \end{pmatrix} \qquad (5)$$

$$\dot{\omega} \times r = \begin{pmatrix} 0 & -\dot{\omega}_z & 0 \\ \dot{\omega}_z & 0 & 0 \\ 0 & 0 & 0 \end{pmatrix} \begin{pmatrix} 0 \\ r_y \\ 0 \end{pmatrix} = \begin{pmatrix} -r_y \dot{\omega}_z \\ 0 \\ 0 \end{pmatrix} \qquad (6)$$

That is, when the rigid body existing at a position represented by the position vector in a Y-axis direction with respect to the origin O performs the rotational motion with the Z direction as the rotation axis, when the angular velocity ω of the rotational motion changes with time along the Z axis, the acceleration in a tangential direction which is a −X-axis direction is generated.

Next, the centripetal acceleration will be specifically discussed with reference to FIG. 8. As in the case of FIG. 7, when the rigid body at the position vector r=(rx, ry, rz) from the origin O is performing the rotational motion, a centripetal acceleration received by the rigid body is represented by Formula (7) using a matrix corresponding to an outer product of the angular velocity vector w and the position vector r.

$$\omega \times (\omega \times r) = \begin{pmatrix} -\omega_y^2 - \omega_z^2 & \omega_x\omega_y & \omega_z\omega_x \\ \omega_x\omega_y & -\omega_z^2 - \omega_x^2 & \omega_y\omega_z \\ \omega_z\omega_x & \omega_x\omega_y & -\omega_x^2 - \omega_y^2 \end{pmatrix} \begin{pmatrix} r_x \\ r_y \\ r_z \end{pmatrix} \quad (7)$$

Therefore, similar to the description with reference to FIG. 7, when the position vector r from the origin O is represented by Formula (3) and the angular velocity vector w is represented by Formula (4), a centripetal acceleration is obtained by Formula (8).

$$\omega \times (\omega \times r) = \begin{pmatrix} -\omega_z^2 & 0 & 0 \\ 0 & -\omega_z^2 & 0 \\ 0 & 0 & 0 \end{pmatrix} \begin{pmatrix} 0 \\ r_y \\ 0 \end{pmatrix} = \begin{pmatrix} 0 \\ -r_y\omega_z^2 \\ 0 \end{pmatrix} \quad (8)$$

That is, when the rigid body existing at the position represented by the position vector in the Y-axis direction with respect to the origin O performs the rotational motion with the Z direction as the rotation axis, the centripetal acceleration in the −Y-axis direction is generated.

As described above, the acceleration applied to the inertial sensor 1 includes an acceleration generated along with the rotational motion. That is, the acceleration has a correlation with the angular velocity.

Next, the inertial sensor disclosed in JP-A-2017-173280 will be discussed. In the inertial sensor, a detection circuit performs range adjustment by changing a voltage value per unit physical quantity based on an output signal passing through an analog filter unit. Then, in a determination circuit, the range is expanded when the output signal exceeds a first threshold value set in advance, and the range is narrowed when the output signal falls below a second threshold value. In this way, the inertial sensor can detect both a gentle movement and a rapid movement.

However, in the inertial sensor, the range adjustment for a certain physical quantity is performed only based on information of the physical quantity. Here, as described with reference to FIGS. 7 and 8, the acceleration applied to the inertial sensor includes, in addition to the translational acceleration, an acceleration component caused by the rotational motion, such as the centripetal acceleration and the tangential acceleration, and these accelerations have a correlation with the angular velocity. Here, when a certain angular velocity is detected, if the range adjustment is performed based only on the angular velocity, the correlation between the angular velocity and the acceleration cannot be considered. For this reason, the angular velocity to be detected cannot be predicted with sufficient accuracy, and a problem also occurs in the range adjustment based on the angular velocity. Therefore, such an inertial sensor has a problem that it cannot accurately detect the acceleration, the angular velocity, or the attitude information obtained based thereon.

Since the range adjustment is determined based on only the physical quantity of a certain axis, even if the motion input to the detection axis is small, if the motion is large in the entire three-dimensional space, the dynamic range will be set to be small with respect to the entire motion. Further, since a principle is that the dynamic range changes only when the detection axis of the inertial sensor shifts to the physical quantity which is a main target of change, there is a chance that the tracking to the change in the physical quantity by the inertial sensor is delayed. Therefore, when a large motion of the physical quantity exceeding the range is input before the dynamic range is changed, the output signal may be saturated and an error may occur. As described above, according to the configuration in the example in the related art, a problem occurs due to the range adjustment based only on the detected physical quantity.

In the inertial sensor disclosed in JP-A-2017-173280, the range adjustment is performed based on a magnitude relationship between the output signal and the threshold value. When the change in the physical quantity in the vicinity of the threshold value continues, the range adjustment may frequently occur. In a general inertial sensor, the change in the dynamic range is adjusted by an amplification gain of the electrical signal, and when the amplification gain is large, the noise superimposed on the output signal is large. Therefore, when the range is frequently changed, the change is superimposed on the output signal as detection noise, which causes a decrease in the detection accuracy of the physical quantity of the inertial sensor.

In this regard, the inertial sensor 1 according to the embodiment predicts a magnitude of the input angular velocity or the acceleration using information on the angular velocity, the acceleration, and the attitude obtained from the inertial sensor 1, and adjusts the dynamic range to an appropriate range.

For example, as shown in the above Formula (6) and the like, the acceleration A has a degree component that occurs with the rotational motion, and a value of the physical quantity to be detected cannot be predicted with sufficient accuracy only by the physical quantity to be detected. Therefore, when the range adjustment of the first physical quantity PQ1 is performed as described above, a value of the first physical quantity PQ1 can be accurately predicted by using the information of the second physical quantity PQ2, which is a physical quantity other than the first physical quantity P1, and the dynamic range of the first physical quantity PQ1 can be set in a more appropriate range. In this way, when there is a rapid change in the angular velocity or when a large angular velocity is input, a sign thereof can be predicted with high accuracy. Therefore, it is possible to detect the physical quantity under appropriate range setting.

As described above, the inertial sensor 1 according to the embodiment includes the first sensor S1 for detecting the first physical quantity PQ1 on the first axis A1, the first detection circuit 61 that performs the detection processing of the first physical quantity PQ1 based on the first sensor signal SS1 from the first sensor S1 and outputs the first detection information DI1, the second sensor S2 for detecting the second physical quantity PQ2 on the second axis A2, the second detection circuit 62 that performs the detection processing of the second physical quantity PQ2 based on the second sensor signal SG2 from the second sensor S2 and outputs the second detection information DI2, and the range setting unit that performs the range setting processing. The range setting unit performs the range setting processing of setting the detection range of the first physical quantity in the first detection circuit based on the first detection information DI1 and the second detection information DI2.

In this way, the inertial sensor 1 can set the detection range for detecting the first physical quantity PQ1 based not only on the first physical quantity PQ1 but also on the second physical quantity PQ2. Therefore, for example, the magnitudes of the angular velocity ω and the acceleration A input to the inertial sensor 1 can be predicted using the angular velocity ω, the acceleration A, or the information on the attitude obtained from the inertial sensor 1, and can be set to an appropriate dynamic range. Therefore, it is possible to detect the physical quantity input to the inertial sensor 1 with high accuracy under the appropriate range setting.

2. Second Embodiment

Next, a second embodiment will be described. The second embodiment is an embodiment that utilizes a property of a centripetal acceleration or a tangential acceleration caused by a rotational motion.

For example, when a vehicle is turned, a tangential acceleration is generated along with the rotation of the yaw angle ψ. Then, when a large X-axis acceleration Ax is detected, since a rapid change in the Z-axis angular velocity ωz is expected from the third term in the above-described Formula (2), a range setting of the Z-axis angular velocity ωz is increased when the X-axis acceleration Ax exceeds a certain threshold value. For example, when the X-axis acceleration Ax exceeds 1000 mG, the range of the Z-axis angular velocity ωz is changed from ±100 deg/s to ±150 deg/s. As described above, in the second embodiment, a detection range of the Z-axis angular velocity ωz is increased when the X-axis acceleration Ax exceeds a certain threshold value. In this way, it is possible to cope with the rapid change in the Z-axis angular velocity ωz, and it is possible to prevent a decrease in detection accuracy.

In the above embodiment, the detection range of the Z-axis angular velocity ωz may be increased when the Y-axis acceleration Ay exceeds a certain threshold value. For example, when the Y-axis acceleration Ay exceeds 1000 mG, the range of the Z-axis angular velocity ωz is changed from +100 deg/s to ±150 deg/s. Also in this case, the same effect can be obtained.

In the embodiment, the first axis A1 is the Z axis, the first physical quantity PQ1 is the Z-axis angular velocity ωz which is an angular velocity around the Z axis, the second axis A2 is the X axis or the Y axis, and the second physical quantity PQ2 is the X-axis acceleration Ax which is an acceleration in the X-axis direction or the Y-axis acceleration Ay which is an acceleration in the Y-axis direction.

In this way, the range adjustment of the Z-axis angular velocity ωz can be set using not only the Z-axis angular velocity ωz but also the X-axis acceleration Ax or the Y-axis acceleration Ay. Therefore, the dynamic range of the Z-axis angular velocity ωz can be set in an appropriate range, and the Z-axis angular velocity ωz can be accurately detected.

In the embodiment, the range setting unit performs setting to increase the detection range of the Z-axis angular velocity ωz when the X-axis acceleration Ax or the Y-axis acceleration Ay exceeds the threshold value.

In this way, it is possible to predict a rapid change in the Z-axis angular velocity ωz from a change in a detection value of the X-axis acceleration Ax. Therefore, it is possible to cope with the rapid change in the Z-axis angular velocity ωz, and it is possible to improve the detection accuracy of the physical quantity of the inertial sensor 1.

Based on Formula (3), for example, the tangential acceleration of the X axis is calculated based on a Y coordinate ry and a Z coordinate rz from the origin O in the rotational motion of each axis, in addition to a temporal change rate of the Z-axis angular velocity ωz and a temporal change rate of the Y-axis angular velocity ωy. Therefore, the range of the X-axis acceleration Ax can be set based on the temporal change rate of the Z-axis angular velocity ωz, the temporal change rate of the Y-axis angular velocity ωy, and a detection value of the Y coordinate ry or the Z coordinate rz. For example, based on the X-axis component of Formula (3), if a product of the temporal change rate of the Z-axis angular velocity and the Y coordinate ry, that is, an absolute value of the first term, is small and a product of the temporal change rate of the Y-axis angular velocity ωy and the Z coordinate rz, that is, an absolute value of the second term, is large, it is predicted that the tangential acceleration of the X-axis acceleration Ax is large. In such a case, by performing the range adjustment to increase the range of the X-axis acceleration Ax, the X-axis acceleration Ax can be accurately detected under appropriate range setting.

When three or more physical quantities are used to adjust the range of a certain physical quantity in this way, the third physical quantity PQ3 can be introduced in addition to the first physical quantity PQ1 and the second physical quantity PQ2. In the above example, the first physical quantity PQ1 may be set as the Z-axis angular velocity ωz, the second physical quantity PQ2 may be set as the Y-axis angular velocity ωy, and the third physical quantity PQ3 may be set as the Y coordinate ry or the Z coordinate rz. Then, the detection processing of the third physical quantity PQ3 is performed by a third sensor 53 (not shown in FIG. 5). The third sensor 53 outputs third detection information DI3 to the range setting unit 140, the attitude calculation unit 150, and a digital filter corresponding to the third physical quantity PQ3.

That is, in the embodiment, the inertial sensor includes a third sensor S3 for detecting the third physical quantity PQ3 on the third axis A3, and a third detection circuit 63 that performs the detection processing of the third physical quantity PQ3 based on a third sensor signal SS3 from the third sensor S3 and outputs the third detection information DI3. The range setting unit performs the range setting processing of setting the detection range of the first physical quantity PQ1 based on the first detection information DI1, the second detection information DI2, and the third detection information DI3.

In this way, the range of the first physical quantity PQ1 can be adjusted using the second physical quantity PQ2 and the third physical quantity PQ3, which are physical quantities other than the first physical quantity PQ1. Therefore, the range adjustment of the first physical quantity PQ1 can be more appropriately performed, and the detection accuracy of the physical quantity of the inertial sensor 1 can be improved.

Although the case where the third physical quantity PQ3 is introduced in addition to the first physical quantity PQ1 and the second physical quantity PQ2 is described above, in the embodiment, the number of physical quantities that can be used for the range adjustment of the first physical quantity PQ1 is not limited. Therefore, it is possible to introduce a physical quantity other than the third physical quantity PQ3.

3. Third Embodiment

Figure 9:
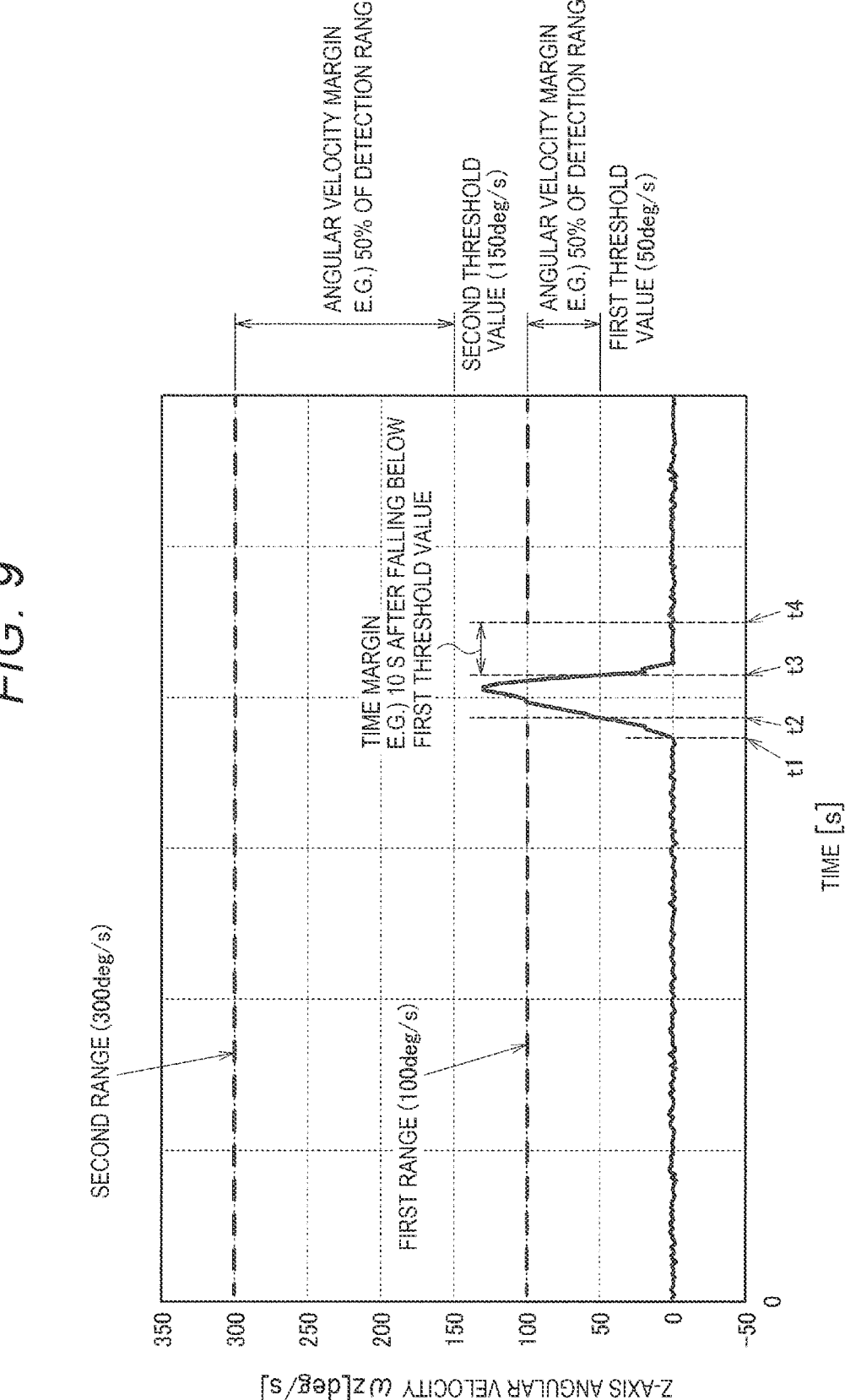
FIG. 9 is a diagram showing an example of range adjustment when a third embodiment is applied.

Next, a third embodiment will be described. FIG. 9 is a diagram showing an example of a specific range adjustment method when the third embodiment is applied. In this method, a range of a certain physical quantity and a threshold value corresponding to the range are provided, and the range adjustment is performed based on a relationship between a detection value of the physical quantity and the threshold value. Here, the range refers to a range covering an assumed changing range of a physical quantity to be detected. The threshold value is, for example, a value that determines a magnitude relationship between physical quantities determined by, for example, multiplying the range by a predetermined ratio.

In a graph shown in FIG. 9, a horizontal axis represents a time (s) and a vertical axis represents the Z-axis angular velocity ωz (deg/s), and the graph shows a temporal change in the Z-axis angular velocity ωz. Further, in the example shown in FIG. 9, two ranges of a first range RA1 and a second range RA2 are set for the Z-axis angular velocity ωz, and a first threshold value TH1 and a second threshold value TH2, which are threshold values corresponding to the ranges, are provided. Here, values of the first threshold value TH1 and the second threshold value TH2 are set to values of 50% of the first range RA1 and the second range RA2, respectively. That is, the first threshold value TH1 is set to 50 deg/s for 100 deg/s of the first range RA1, and the second threshold value TH2 is set to 150 deg/s for 300 deg/s of the second range RA2. A ratio of the threshold value to the range may be different between the first threshold value TH1 and the second threshold value TH2, and only the second threshold value TH2 may be set to 210 deg/s, which is 70% of the second range RA2. That is, a predetermined ratio for determining the threshold value corresponding to each range can be freely determined.

When explaining a specific processing referring to FIG. 9, in a period from a time point 0 to a time point t1, the Z-axis angular velocity ωz is a value in the vicinity of 0 and is within the range of the first range RA1. Then, after the time point t1, the Z-axis angular velocity ωz starts to increase, and is larger than 50 deg/s, which is the first threshold value TH1, at a time point t2. Therefore, the range setting unit performs the range adjustment at the time point t2, and changes the range setting to 300 deg/s, which is the second range RA2. After the time point t2, the Z-axis angular velocity ωz starts to decrease without exceeding 150 deg/s which is the second threshold value TH2 of the second range RA2, and decreases to a value equal to or less than 50 deg/s of the first threshold value TH1 at a time point t3.

Then, the range setting unit performs the range adjustment at a time point t4, and returns the range setting to 100 deg/s of the first range RA1. Here, as shown in FIG. 9, the Z-axis angular velocity ωz decreases to be equal to or less than the first threshold value TH1 at the time point t3, but the range setting unit maintains the range setting in the second range RA2 for 10 seconds even after the Z-axis angular velocity ωz is equal to or less than the first threshold value TH1. The range setting unit returns the range setting to the first range RA1 at the time point t4 when 10 seconds elapses since the angular velocity is equal to or less than the second threshold value TH2.

As described above, even when the physical quantity to be detected falls below the corresponding threshold value within a certain range, by maintaining the current range setting for a predetermined period, it is possible to avoid frequent change in the range setting and to prevent detection noise of the physical quantity associated therewith. For example, the physical quantity to be detected may frequently increase or decrease with the threshold value interposed therebetween, and in this case, if a range change is performed each time, detection noise occurs. From such a viewpoint, it is desirable to maintain the current range setting for a predetermined period when the detection value of the physical quantity falls below the threshold value. The predetermined period is set to 10 s in FIG. 9, and is not limited thereto.

That is, in the embodiment, the range setting unit sets, when the detection value of the first detection information DI1 exceeds the first threshold value TH1 in the first range RA1 while the first detection circuit 61 is performing the detection processing of the first physical quantity PQ1 in the first range RA1, the detection range of the first physical quantity PQ1 to the second range RA2 that is larger than the first range RA1.

In this way, by determining the detection range of the physical quantity to be detected based on the magnitude relationship between the threshold value and the detection value, it is possible to set an appropriate range at each time point. By providing the threshold value corresponding to each range, the range adjustment processing can be flexibly executed.

Figure 10:
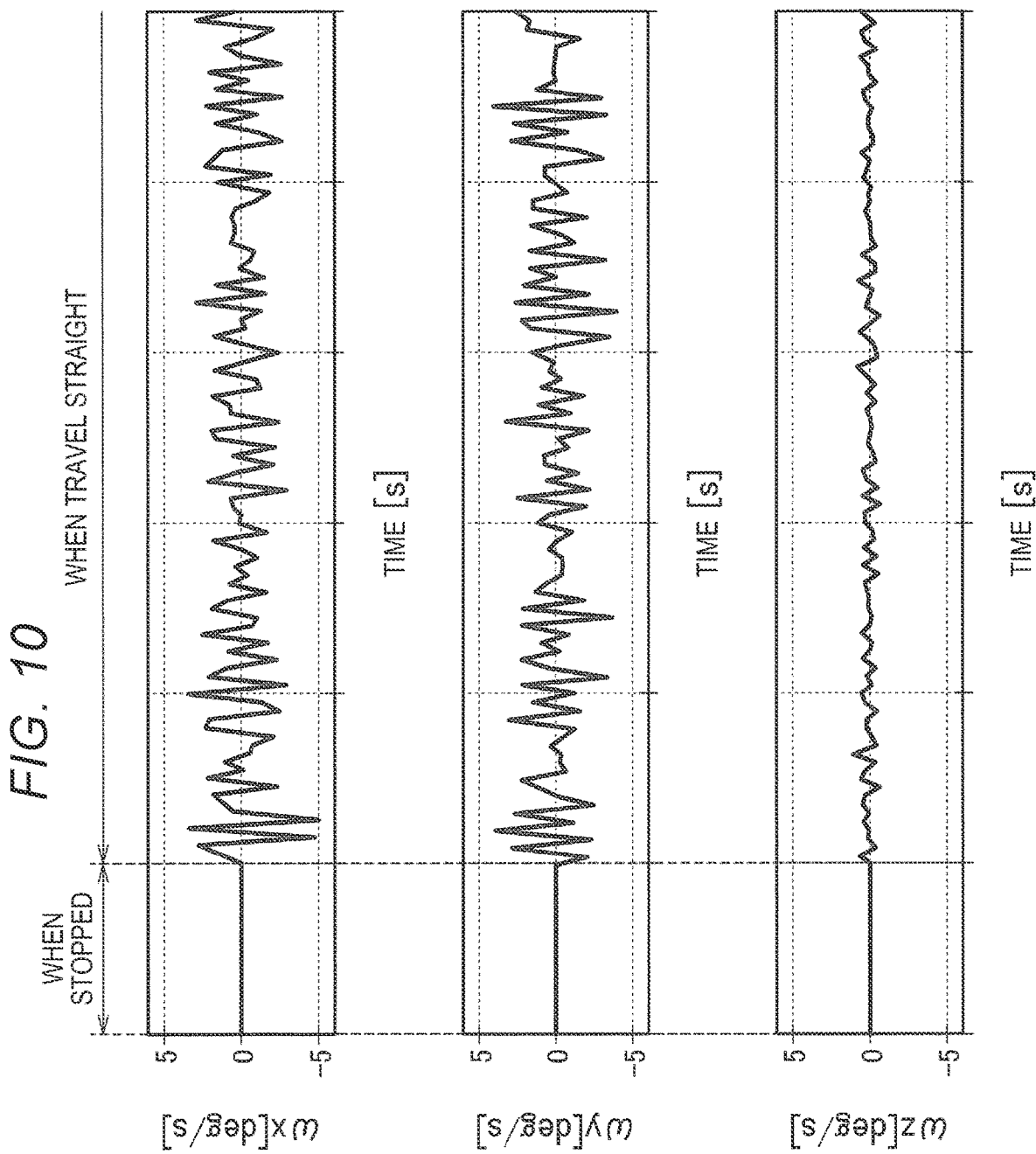
FIG. 10 is a diagram showing an example of a temporal change in an angular velocity.

FIG. 10 is an example of data of the angular velocity ω actually output by the inertial sensor 1 mounted on an automobile or the like traveling on a road surface. In each graph of FIG. 10, a horizontal axis represents a time (s), a vertical axis represents the X-axis angular velocity ωx (deg/s) in an upper graph, the Y-axis angular velocity ωy (deg/s) in the middle graph, and the Z-axis angular velocity ωz (deg/s) in a lower graph. Specifically, the X-axis angular velocity ωx corresponds to a rotational angular velocity having a vehicle front-rear direction as an axis. The Y-axis angular velocity ωy and the Z-axis angular velocity ωz correspond to a rotational angular velocity having a vehicle left-right direction as an axis and a rotational angular velocity having a vehicle up-down direction as an axis, respectively. A predetermined period on the left side of each graph indicates a behavior of each angular velocity ω at the time of stopping, and the right side thereof indicates a behavior of the angular velocity ω at the time of straight traveling. When the vehicle stops, each angular velocity ω is constant at 0. When the vehicle starts to travel straight, a large data change appears in each of the X-axis angular velocity ωx and the Y-axis angular velocity ωy. In an automobile or the like traveling on a road surface, the X-axis angular velocity ωx and the Y-axis angular velocity ωy are rapidly changed due to an influence of road surface unevenness. Due to such a factor, a large change appears in the X-axis angular velocity ωx and the Y-axis angular velocity ωy in the graphs shown in the upper part and the middle part of FIG. 10. On the other hand, the Z-axis angular velocity ωz shown in the lower graph is different from the X-axis angular velocity ωx and the Y-axis angular velocity ωy, and the change in the angular velocity is within a relatively gentle range. This is because the Z-axis angular velocity ωz is detected mainly when the automobile or the like turns right or left, and is less likely to occur in other straight traveling.

As shown in FIG. 10, in the X-axis angular velocity ωx and the Y-axis angular velocity ωy, since the angular velocity rapidly changes in a short time, it is desirable to set an initial setting of the dynamic range of the angular velocity to be wide in advance. Here, the initial setting is, for example, a first state when the automobile starts from a stationary state, and also includes a first state when the automobile starts from a temporarily stopped state. Therefore, when the setting ranges of the dynamic ranges of the X-axis angular velocity ωx, the Y-axis angular velocity ωy, and the Z-axis angular velocity ωz are Rωx, Rωy, and Rωz, respectively, the dynamic ranges are set to satisfy Rωz≤Rωx or Rωz≤Rωy, thereby making it possible to cope with the rapid change in the angular velocity as described above. In this way, a decrease in detection accuracy of the inertial sensor 1 can be prevented. For example, the dynamic range may be initially set to Rωx=±200 deg/s, Rωy=±200 deg/s, and Rωz=±100 deg/s when the inertial sensor 1 is started. The initial setting of the dynamic range may not be Rωx=Rωy as described above.

That is, in the embodiment, the first axis A1 is the X axis or the Y axis. The first physical quantity PQ1 is the X-axis angular velocity ωx which is an angular velocity around the X axis or the Y-axis angular velocity ωy which is an angular velocity around the Y axis. The second axis A2 is the Z axis. The second physical quantity PQ2 is the Z-axis angular velocity ωz which is an angular velocity around the Z axis. The range setting unit sets, in the initial setting, the detection range of the Z-axis angular velocity to a magnitude equal to or smaller than the detection range of the X-axis angular velocity ωx or the Y-axis angular velocity ωy.

In this way, it is possible to detect the Z-axis angular velocity ωz with high accuracy and to cope with the rapid change in the X-axis angular velocity ωx and the Y-axis angular velocity ωy, and it is possible to prevent the decrease in the detection accuracy of the physical quantity in the inertial sensor 1.

Figure 11:
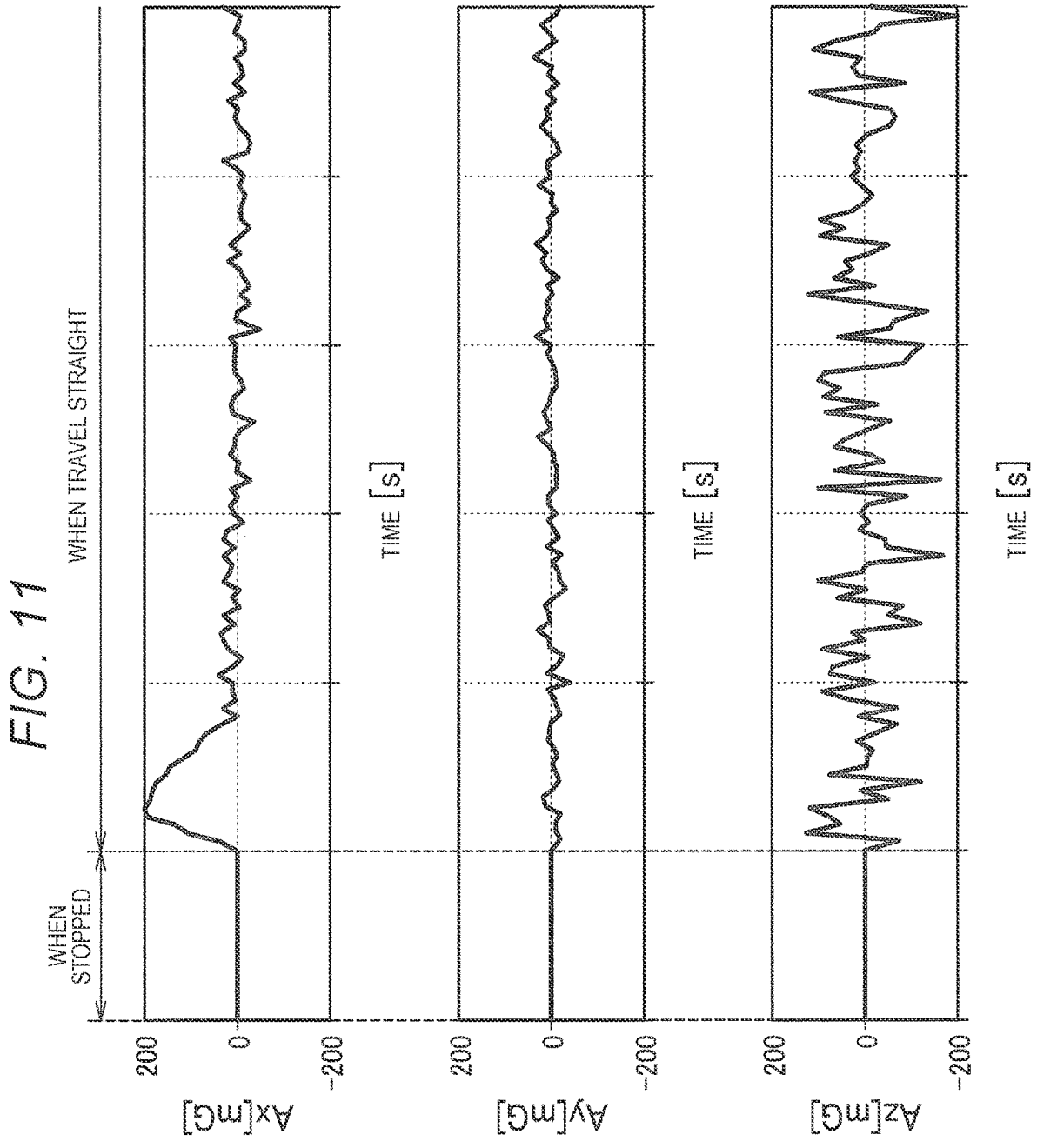
FIG. 11 is a diagram showing an example of a temporal change in an acceleration.

FIG. 11 is an example of data of the acceleration A output by the inertial sensor 1 mounted on an automobile or the like traveling on a road surface in the same manner as in FIG. 10. Similar to FIG. 10, a horizontal axis represents a time (s), and a vertical axis represents the X-axis acceleration Ax (mG) in an upper graph, the Y-axis acceleration Ay (mG) in the middle graph, and the Z-axis acceleration Az (mG) in a lower graph. The X-axis acceleration Ax is an acceleration in the vehicle front-rear direction, and the Y-axis acceleration Ay and the Z-axis acceleration Az are an acceleration in the vehicle left-right direction and an acceleration in the vehicle up-down direction, respectively. Similar to FIG. 10, the acceleration is constant at 0 when the vehicle is stopped, but changes appear in the accelerations when the vehicle starts to travel straight. As in the case of FIG. 10, an automobile or the like traveling on a road surface is strongly affected by road surface unevenness. That is, the Z-axis acceleration rapidly changes due to an influence of up-down vibration in addition to the gravitational acceleration. Due to such a factor, in FIG. 11, a relatively gentle change appears in the X-axis acceleration Ax and the Y-axis acceleration Ay shown in the upper part and the middle part, respectively, and a rapid change appears in the Z-axis acceleration Az shown in the lower part. Therefore, in order to track the Z-axis acceleration in which the angular velocity rapidly changes in a short time, it is desirable to set the initial setting of the dynamic range of the Z-axis acceleration to be wide in advance. Therefore, when the setting ranges of the dynamic ranges of the X-axis acceleration Ax, the Y-axis acceleration Ay, and the Z-axis acceleration Az are RAx, RAy, and RAz, respectively, the dynamic ranges are set to satisfy RAz RAx or RAz≥RAy, thereby making it possible to cope with the rapid change in the angular velocity as described above. In this way, a decrease in detection accuracy of the inertial sensor 1 can be prevented. For example, the dynamic range may be initially set to RAx=±2 G, RAy=±2 G, and RAz=±8 G when the inertial sensor 1 is started. The initial setting of the dynamic range may not be RAx=RAy as described above. Further, although the gravitational acceleration is removed in the above description, the inertial sensor 1 detects the acceleration to which the gravitational acceleration of about 1000 mG is added.

That is, in the embodiment, in the inertial sensor, the first axis A1 is the X axis or a Y axis. The first physical quantity PQ1 is the X-axis acceleration Ax which is an acceleration in the X-axis direction or the Y-axis acceleration Ay which is an acceleration in the Y-axis direction. The second axis A2 is the Z axis. The second physical quantity PQ2 is the Z-axis acceleration Az which is an acceleration in the Z-axis direction. The range setting unit sets, in the initial setting, the detection range of the Z-axis acceleration Az to a magnitude equal to or larger than the detection range of the X-axis acceleration Ax or the Y-axis acceleration Ay.

In this way, it is possible to cope with rapid changes in the X-axis acceleration Ax and the Y-axis acceleration Ay while detecting the Z-axis acceleration Az with high accuracy. It is possible to prevent a decrease in detection accuracy of the physical quantity in the inertial sensor 1.

4. Fourth Embodiment

Next, a fourth embodiment will be described. The fourth embodiment is an embodiment using a correlation between the angular velocity and the yaw angle ψ for identifying the attitude. As described with reference to FIG. 6, the attitude can be identified using, for example, the Euler angles. The Euler angles are calculated, for example, by time-integrating a gyro sensor output. The roll angle φ, the pitch angle θ, and the yaw angle ψ are related to the X-axis angular velocity ωx, the Y-axis angular velocity ωy, and the Z-axis angular velocity ωz as in Formula (9).

$$\begin{pmatrix} \dot{\Phi} \\ \dot{\Theta} \\ \dot{\Psi} \end{pmatrix} = \begin{pmatrix} 1 \\ 0 \\ 0 \end{pmatrix} \omega_x + \begin{pmatrix} \sin\Phi\tan\Theta \\ \cos\Phi \\ \sin\Phi/\cos\Theta \end{pmatrix} \omega_y + \begin{pmatrix} \cos\Phi\tan\Theta \\ -\sin\Phi \\ \cos\Phi/\cos\Theta \end{pmatrix} \omega_z \qquad (9)$$

$$= \begin{pmatrix} 1 & \sin\Phi\tan\Theta & \cos\Phi\tan\Theta \\ 0 & \cos\Phi & -\sin\Phi \\ 0 & \sin\Phi/\cos\Theta & \cos\Phi/\cos\Theta \end{pmatrix} \begin{pmatrix} \omega_x \\ \omega_y \\ \omega_z \end{pmatrix}$$

$$= \begin{pmatrix} \omega_x + \omega_y\sin\Phi\tan\Theta + \omega_z\cos\Phi\tan\Theta \\ \omega_y\cos\Phi - \omega_z\sin\Phi \\ \omega_y\sin\Phi/\cos\Theta + \omega_z\cos\Phi/\cos\Theta \end{pmatrix}$$

Formula (9) is a theoretical formula for calculating a temporal change in attitude or orientation based on the angular velocity ω. Then, when both sides of Formula (9) are integrated with time, Formula (10) indicating a change in attitude is derived.

$$\begin{pmatrix} \Delta\Phi \\ \Delta\Theta \\ \Delta\Psi \end{pmatrix} = \begin{pmatrix} \omega_x + \omega_y\sin\Phi\tan\Theta + \omega_z\cos\Phi\tan\Theta \\ \omega_y\cos\Phi - \omega_z\sin\Phi \\ \omega_y\sin\Phi/\cos\Theta + \omega_z\cos\Phi/\cos\Theta \end{pmatrix} \Delta t \qquad (10)$$

Based on Formula (10), it can be seen that the calculation of the yaw angle ψ requires information on the roll angle φ and the pitch angle θ as well as the angular velocity of the Z component. This corresponds to the fact that, for example, the automobile has a little inclination with respect to the ground, and in order to accurately detect the attitude, it is necessary to perform correction by the roll angle φ or the pitch angle θ corresponding to the inclination. Therefore, in order to accurately detect the yaw angle ψ, it is important to accurately detect the X-axis angular velocity ωx and the Y-axis angular velocity ωy which are time differentiations of the roll angle φ and the pitch angle θ. Here, when the Z-axis angular velocity ωz is already a large value, there is a limit in reducing the range of the Z-axis angular velocity ωz to reduce the detection noise. On the other hand, the X-axis angular velocity ωx and the Y-axis angular velocity ωy may still have a margin for range adjustment. Therefore, in the fourth embodiment, when the angular velocity of the Z-axis angular velocity ωz exceeds a certain threshold value, the detection range of the X-axis angular velocity ωx or the Y-axis angular velocity ωy is reduced. In this way, by reducing the range of the X-axis angular velocity ωx or the Y-axis angular velocity ωy, it is possible to improve the detection accuracy of the yaw angle ψ for identifying the attitude while maintaining the detection accuracy of the Z-axis angular velocity ωz.

FIG. 12 is a table showing an example of change patterns of range settings and threshold values for each physical quantity when using the fourth embodiment. For example, in the example of FIG. 12, in an initial state, the range setting of the X-axis angular velocity ωx and the Y-axis angular velocity ωy is set to ±200 deg/s, and the range setting of the Z-axis angular velocity ωz is set to ±100 deg/s. Further, when the Z-axis angular velocity ωz is +45 deg/s in the first state and exceeds 30 deg/s of the first threshold value TH1, the range setting unit performs the range adjustment to reduce the ranges of the X-axis angular velocity ωx and the Y-axis angular velocity ωy to ±150 deg/s and maintain the Z-axis angular velocity ωz at ±100 deg/s. In this way, detection noise can be reduced by reducing the ranges of the X-axis angular velocity ωx and the Y-axis angular velocity ωy while covering the increased detection range of the Z-axis angular velocity ωz.

In a second state, the Z-axis angular velocity ωz increases to ±55 deg/s, which is larger than 50 deg/s of the second threshold value TH2 of the Z-axis angular velocity ωz. Therefore, the range of the Z-axis angular velocity ωz is increased to ±200 deg/s, and the ranges of the X-axis angular velocity ωx and the Y-axis angular velocity ωy are reduced to 150 deg/s by an increase in the range of the Z-axis angular velocity ωz. In this way, an increase in detection noise can be prevented by lowering the ranges of the X-axis angular velocity ωx and the Y-axis angular velocity ωy while covering the increased detection range of the Z-axis angular velocity ωz. In a right column of FIG. 12, a magnitude relationship of the ranges of the physical quantities is shown. Assuming that widths of the ranges of the X-axis angular velocity ωx, the Y-axis angular velocity ωy, and the Z-axis angular velocity ωz are X, Y, and Z, respectively, the magnitude relationship of the ranges of the physical quantities is maintained in the initial state, the first state, and the second state. A third state and a fourth state are cases where the Z-axis angular velocity ωz increases from the initial state, and the X-axis angular velocity ωx or the Y-axis angular velocity ωy also increases. In such a case, since there is no margin to reduce the range of the physical quantity whose detection value is increased, processing of reducing the range is performed only for the physical quantity whose detection value does not increase. For example, in the third state, the range is reduced to 150 deg/s only for the X-axis angular velocity ωx whose detection value remains ±5 deg/s and does not increase. In this way, the detection noise of the inertial sensor 1 can be prevented by reducing the range of the X-axis angular velocity ωx or the Y-axis angular velocity ωy having the margin of reducing the range while maintaining the detection of the physical quantity with high accuracy for the Z-axis angular velocity ωz and the X-axis angular velocity ωx or the Y-axis angular velocity ωy whose detection value is increased. In the third state and the fourth state, the magnitude relationship of the ranges shown in the column on the right side of FIG. 12 changes from the initial state, and Z<X<Y is satisfied in the third state and Z<Y<X is satisfied in the fourth state. As described above, various range adjustment patterns can be considered without being limited to the magnitude relationship of the range setting in each state shown in FIG. 12.

That is, in the embodiment, the range setting unit sets the detection range of the X-axis angular velocity ωx or the Y-axis angular velocity ωy to be small when the Z-axis angular velocity ωz exceeds the threshold value.

In this way, the detection noise of the inertial sensor 1 can be prevented by reducing the ranges of the X-axis angular velocity ωx and the Y-axis angular velocity ωy while covering the detection value of the Z-axis angular velocity ωz. Therefore, the inertial sensor 1 can detect the yaw angle ψ of the Euler angles with high accuracy.

5. Fifth Embodiment

Finally, a fifth embodiment will be described. The fifth embodiment is also an example in which attitude information is used for range adjustment of a physical quantity as in the fourth embodiment. Based on Formula (10) described above, information on the roll angle φ and the pitch angle θ is necessary for the calculation of the yaw angle ψ. Specifically, the roll angle φ and the pitch angle θ are included in coefficients of the Y-axis angular velocity ωy and the Z-axis angular velocity ωz in Formula (10), and when the roll angle φ and the pitch angle θ are large, a contribution of the Y-axis angular velocity ωy and the Z-axis angular velocity ωz to the calculation of the yaw angle ψ is greatly affected. Therefore, in the fifth embodiment, when the roll angle φ and the pitch angle θ exceed certain threshold values, the range of the X-axis angular velocity ωx or the Y-axis angular velocity ωy can be reduced. In this way, when the roll angle φ or the pitch angle θ exceeds a certain threshold value, the range of the X-axis angular velocity ωx or the Y-axis angular velocity ωy is reduced, so that the detection accuracy of the yaw angle ψ can be expected to be improved.

FIG. 13 is a table showing an example of change patterns of range settings and threshold values for each physical quantity when using the fifth embodiment. In an initial state, the roll angle φ and the pitch angle θ are 0, and the range of the X-axis angular velocity ωx is set to ±200 deg/s and the range of the Y-axis angular velocity ωy is set to ±200 deg/s. Then, when the roll angle φ and the pitch angle θ exceed ±5 deg of a set threshold value and are ±6 deg due to a situation in which unevenness of the road surface is severe in the first state, the ranges of the X-axis angular velocity ωx and the Y-axis angular velocity ωy are changed to 150 deg/s. When the detection value of the Y-axis angular velocity ωy is small, the range of the Y-axis angular velocity ωy can be reduced to ±100 deg/s, as shown in the second state. On the other hand, the third state and the fourth state are cases where one of the X-axis angular velocity ωx and the Y-axis angular velocity ωy has a large value of ±45 deg/s. In the third state, since the Y-axis angular velocity ωy is large and there is no margin to further reduce the Y-axis angular velocity ωy, the range of the Y-axis angular velocity ωy is maintained at ±200 deg/s and only the range of the X-axis angular velocity ωx is changed to 150 deg/s. In this way, the detection noise can be reduced by lowering the range of the X-axis angular velocity ωx while maintaining the detection accuracy of the Y-axis angular velocity ωy, and the yaw angle ψ can be detected with high accuracy. As for the magnitude relationship of the range setting of each physical quantity, similarly to the description in FIG. 12, the magnitude relationship of the range setting after the range adjustment is not limited to the case of the first state to the fourth state shown in FIG. 13.

In the embodiment, the inertial sensor 1 includes the attitude calculation unit 150 that obtains attitude information of a measurement target based on the first detection information DI1 and the second detection information DI2, and the range setting unit performs the range setting processing based on the attitude information obtained by the attitude calculation unit 150.

As shown in Formula (10), for example, $\Delta\psi$ indicating a change in attitude is calculated based on the Y-axis angular velocity $\omega y$, the Z-axis angular velocity $\omega z$, and the roll angle $\varphi$ and the pitch angle $\theta$ identifying the attitude before the change. Therefore, according to the embodiment, the attitude calculation unit 150 can calculate a current attitude by obtaining the change $\Delta\psi$ of the yaw angle $\psi$ using, for example, the Y-axis angular velocity $\omega y$ and the Z-axis angular velocity $\omega z$. Therefore, the range setting unit can perform more accurate range adjustment using the attitude information such as $\Delta\psi$ calculated by the attitude calculation unit 150 in addition to the acceleration A and the angular velocity $\omega$. Therefore, the inertial sensor 1 can detect the physical quantity with high accuracy.

In the embodiment, the first axis A1 is the X axis or the Y axis. The first physical quantity PQ1 is the X-axis angular velocity $\omega x$ which is an angular velocity around the X axis or the Y-axis angular velocity $\omega y$ which is an angular velocity around the Y axis. The attitude calculation unit 150 obtains, as the attitude information, the roll angle $\varphi$ which is a rotation angle around the X axis or the pitch angle $\theta$ which is a rotation angle around the Y axis. The range setting unit sets the detection range of the X-axis angular velocity $\omega x$ or the Y-axis angular velocity $\omega y$ to be small when the roll angle $\varphi$ or the pitch angle $\theta$ exceeds the threshold value.

In this way, when the roll angle $\varphi$ or the pitch angle $\theta$ exceeds a certain threshold value, the range of the X-axis angular velocity $\omega x$ or the Y-axis angular velocity $\omega y$ is reduced, so that the detection noise of the inertial sensor 1 can be prevented. Therefore, the inertial sensor 1 can detect the yaw angle $\psi$ with high accuracy.

That is, in the embodiment, the first axis A1 is the X axis or the Y axis. The first physical quantity PQ1 is the X-axis angular velocity $\omega x$ which is an angular velocity around the X axis or the Y-axis angular velocity $\omega y$ which is an angular velocity around the Y axis. The second axis A2 is the Z axis. The second physical quantity PQ2 is the Z-axis angular velocity $\omega z$ which is an angular velocity around the Z axis. The range setting unit sets, in the initial setting, the detection range of the Z-axis angular velocity to a magnitude equal to or smaller than the detection range of the X-axis angular velocity $\omega x$ or the Y-axis angular velocity $\omega y$.

In this way, it is possible to detect the Z-axis angular velocity $\omega z$ with high accuracy and to cope with rapid changes in the X-axis angular velocity $\omega x$ and the Y-axis angular velocity $\omega y$, and it is possible to prevent a decrease in the detection accuracy of the physical quantity in the inertial sensor 1.

In the embodiment, the inertial sensor 1 includes the attitude calculation unit 150 that obtains attitude information of a measurement target based on the first detection information DI1, the second detection information DI2, and the third detection information DI3, and the range setting unit performs the range setting processing based on the attitude information obtained by the attitude calculation unit 150.

As described above, the change $\Delta\psi$ of the yaw angle $\psi$ identifying the attitude is calculated based on the Y-axis angular velocity $\omega y$, the Z-axis angular velocity $\omega z$, and the roll angle $\varphi$ and the pitch angle $\theta$ identifying the attitude before the change. Therefore, according to the embodiment, the attitude calculation unit 150 can more accurately calculate the change $\Delta\psi$ of the yaw angle $\psi$ by using the Y-axis angular velocity $\omega y$ and the Z-axis angular velocity $\omega z$ and further using the roll angle $\varphi$ or the pitch angle $\theta$ of the attitude information. Accordingly, the range setting unit can perform the range adjustment using the highly accurate attitude information calculated by the attitude calculation unit 150. Therefore, the inertial sensor 1 can detect the physical quantity with high accuracy.

As described above, an inertial sensor according to the embodiment includes a first sensor, a first detection circuit, a second sensor, a second detection circuit, and a range setting unit. The first sensor detects a first physical quantity on a first axis. The first detection circuit performs detection processing of the first physical quantity based on a first sensor signal from the first sensor, and outputs first detection information. The second sensor detects a second physical quantity on a second axis. The second detection circuit performs the detection processing of the second physical quantity based on a second sensor signal from the second sensor, and outputs second detection information. The range setting unit performs range setting processing of setting a detection range of the first physical quantity in the first detection circuit based on the first detection information and the second detection information.

According to the embodiment, the inertial sensor can set the detection range for detecting the first physical quantity based not only on the first physical quantity but also on the second physical quantity. Therefore, the detection range of the first physical quantity input to the inertial sensor can be more accurately set, and the first physical quantity can be detected with high accuracy.

In the embodiment, the first axis is an X axis or a Y axis, the first physical quantity is an X-axis angular velocity which is an angular velocity around the X axis or a Y-axis angular velocity which is an angular velocity around the Y axis, the second axis is a Z axis, and the second physical quantity is a Z-axis angular velocity which is an angular velocity around the Z axis.

In this way, the Z-axis angular velocity can be predicted using the X-axis angular velocity or the Y-axis angular velocity in addition to the Z-axis angular velocity, and the Z-axis angular velocity can be predicted with high accuracy. Therefore, it is possible to appropriately set the detection range of the Z-axis angular velocity based on an accurately predicted value of the Z-axis angular velocity, and it is possible to detect the physical quantity of the inertial sensor with high accuracy.

In the embodiment, the range setting unit sets the detection range of the X-axis angular velocity $\omega x$ or the Y-axis angular velocity $\omega y$ to be small when the Z-axis angular velocity $\omega z$ exceeds a threshold value.

In this way, the detection noise of the inertial sensor can be prevented by reducing the ranges of the X-axis angular velocity and the Y-axis angular velocity while covering a detection value of the Z-axis angular velocity. Therefore, the inertial sensor can detect a yaw angle of Euler angles with high accuracy.

In the embodiment, the first axis is the Z axis, the first physical quantity is the Z-axis angular velocity which is an angular velocity around the Z axis, the second axis is the X axis or the Y axis, and the second physical quantity is an X-axis acceleration which is an acceleration in an X-axis direction or a Y-axis acceleration which is an acceleration in a Y-axis direction.

In this way, the range adjustment of the Z-axis angular velocity can be set using not only the Z-axis angular velocity but also the X-axis acceleration or the Y-axis acceleration. Therefore, a dynamic range of the Z-axis angular velocity can be set in an appropriate range, and the Z-axis angular velocity can be accurately detected.

In the embodiment, the range setting unit performs setting to increase the detection range of the Z-axis angular velocity when the X-axis acceleration or the Y-axis acceleration exceeds the threshold value.

In this way, it is possible to predict a rapid change in the Z-axis angular velocity from a change in a detection value of the X-axis acceleration. Therefore, it is possible to cope with the rapid change in the Z-axis angular velocity, and it is possible to improve the detection accuracy of the physical quantity of the inertial sensor.

In the embodiment, the inertial sensor includes a attitude calculation unit that obtains attitude information of a measurement target based on the first detection information and the second detection information, and the range setting unit performs the range setting processing based on the attitude information obtained by the attitude calculation unit.

In this way, the attitude calculation unit can calculate a current attitude by obtaining a change in the yaw angle using, for example, the Y-axis angular velocity and the Z-axis angular velocity. Therefore, the range setting unit can perform more accurate range adjustment using the attitude information calculated by the attitude calculation unit in addition to the acceleration and the angular velocity. Therefore, the inertial sensor can detect the physical quantity with high accuracy.

In the embodiment, the first axis is the X axis or the Y axis. The first physical quantity is the X-axis angular velocity which is an angular velocity around the X axis or the Y-axis angular velocity which is an angular velocity around the Y axis. The attitude calculation unit obtains, as the attitude information, a roll angle which is a rotation angle around the X axis or a pitch angle which is a rotation angle around the Y axis. The range setting unit sets the detection range of the X-axis angular velocity or the Y-axis angular velocity to be small when the roll angle or the pitch angle exceeds the threshold value.

In this way, when the roll angle or the pitch angle exceeds a certain threshold value, the range of the X-axis angular velocity or the Y-axis angular velocity is reduced, so that the detection noise of the inertial sensor can be prevented. Therefore, the inertial sensor can detect the yaw angle with high accuracy.

In the embodiment, the first axis is the X axis or the Y axis. The first physical quantity is the X-axis angular velocity which is an angular velocity around the X axis or the Y-axis angular velocity which is an angular velocity around the Y axis. The second axis is the Z axis. The second physical quantity is the Z-axis angular velocity which is an angular velocity around the Z axis. The range setting unit sets, in an initial setting, the detection range of the Z-axis angular velocity to a magnitude equal to or smaller than the detection range of the X-axis angular velocity or the Y-axis angular velocity.

In this way, it is possible to detect the Z-axis angular velocity with high accuracy and to cope with rapid changes in the X-axis and the Y-axis angular velocities, and it is possible to prevent a decrease in the detection accuracy of the physical quantity in the inertial sensor.

In the embodiment, the first axis is the X axis or the Y axis. The first physical quantity is an X-axis acceleration which is an acceleration in the X-axis direction or a Y-axis acceleration which is an acceleration in the Y-axis direction. The second axis is the Z axis. The second physical quantity is a Z-axis acceleration which is an acceleration in the Z-axis direction. The range setting unit sets, in the initial setting, the detection range of the Z-axis acceleration to a magnitude equal to or larger than the detection range of the X-axis acceleration or the Y-axis acceleration.

In this way, it is possible to cope with rapid changes in the X-axis acceleration and the Y-axis acceleration while detecting the Z-axis acceleration with high accuracy. It is possible to prevent a decrease in detection accuracy of the physical quantity in the inertial sensor.

In the embodiment, the inertial sensor includes a third sensor for detecting a third physical quantity on a third axis, and a third detection circuit that performs the detection processing of the third physical quantity based on a third sensor signal from the third sensor and outputs third detection information. The range setting unit performs the range setting processing of setting the detection range of the first physical quantity based on the first detection information, the second detection information, and the third detection information.

In this way, the range of the first physical quantity can be adjusted using the second physical quantity and the third physical quantity, which are physical quantities other than the first physical quantity. Therefore, the range adjustment of the first physical quantity can be more appropriately performed, and the detection accuracy of the physical quantity of the inertial sensor can be improved.

In the embodiment, the inertial sensor includes an attitude calculation unit that obtains attitude information of a measurement target based on the first detection information, the second detection information, and the third detection information, and the range setting unit performs the range setting processing based on the attitude information obtained by the attitude calculation unit.

In this way, the attitude calculation unit can more accurately calculate a change in the yaw angle by using the Y-axis angular velocity and the Z-axis angular velocity and further using the roll angle or the pitch angle of the attitude information. Therefore, the range setting unit can perform the range adjustment using the highly accurate attitude information calculated by the attitude calculation unit, and the inertial sensor can detect the physical quantity with high accuracy.

In the embodiment, the range setting unit sets, when a detection value of the first detection information exceeds a first threshold value in a first detection range while the first detection circuit is performing the detection processing of the first physical quantity in the first detection range, the detection range of the first physical quantity to a second detection range larger than the first detection range.

In this way, by determining the detection range of the physical quantity to be detected based on the magnitude relationship between the threshold value and the detection value, it is possible to set an appropriate range at each time point. By providing the threshold value corresponding to each range, the range adjustment processing can be flexibly executed.

Although the embodiments have been described in detail as described above, it can be readily apparent to those skilled in the art that many modifications may be made without departing substantially from novel matters and effects of the present disclosure. Accordingly, such modifications are intended to be included in the scope of the present disclosure. For example, a term cited with a different term having a broader meaning or the same meaning at least once in the description or in the drawings can be replaced with the different term at any place in the description or in the drawings. All combinations of the embodiments and the modifications are also in the scope of the present disclosure. The configuration, operation, and the like of the inertial sensor are not limited to those described in the embodiment, and various modifications can be made.

What is claimed is:

1. An inertial sensor comprising:
a first sensor configured to detect a first physical quantity only on a first axis;
a first detection circuit configured to perform detection processing of the first physical quantity based on a first sensor signal from the first sensor, and output first detection information;
a second sensor configured to detect a second physical quantity only on a second axis, the second axis being different than the first axis;
a second detection circuit configured to perform the detection processing of the second physical quantity based on a second sensor signal from the second sensor including determining whether the second physical quantity exceeds a threshold value, and output second detection information that includes an indication of whether the second physical quantity exceeds the threshold value; and
a range setting unit configured to perform range setting processing,
wherein the range setting unit is configured to perform the range setting processing of adjusting a detection range of the first physical quantity in the first detection circuit based on both the first detection information and the second detection information including the indication of whether the second physical quantity exceeds the threshold value, such that the detection range of the first physical quantity is adjusted in response to the second physical quantity exceeding the threshold value as detected by the second detection circuit on the second axis that is different from the first axis.

2. The inertial sensor according to claim 1, wherein the first axis is an X axis or a Y axis,
the first physical quantity is an X-axis angular velocity which is an angular velocity around the X axis or a Y-axis angular velocity which is an angular velocity around the Y axis,
the second axis is a Z axis, and
the second physical quantity is a Z-axis angular velocity which is an angular velocity around the Z axis.

3. The inertial sensor according to claim 2, wherein the range setting unit is configured to set, when the Z-axis angular velocity exceeds the threshold value, a detection range of the X-axis angular velocity or the Y-axis angular velocity to be small.

4. The inertial sensor according to claim 1, wherein the first axis is a Z axis,
the first physical quantity is a Z-axis angular velocity which is an angular velocity around the Z axis,
the second axis is an X axis or a Y axis, and
the second physical quantity is an X-axis acceleration which is an acceleration in an X-axis direction or a Y-axis acceleration which is an acceleration in a Y-axis direction.

5. The inertial sensor according to claim 4, wherein the range setting unit is configured to set, when the X-axis acceleration or the Y-axis acceleration exceeds the threshold value, a detection range of the Z-axis angular velocity to be large.

6. The inertial sensor according to claim 1, further comprising:

an attitude calculation unit configured to obtain attitude information of a measurement target based on the first detection information and the second detection information, wherein
the range setting unit is configured to perform the range setting processing based on the attitude information obtained by the attitude calculation unit.

7. The inertial sensor according to claim 6, wherein the first axis is an X axis or a Y axis,
the first physical quantity is an X-axis angular velocity which is an angular velocity around the X axis or a Y-axis angular velocity which is an angular velocity around the Y axis,
the attitude calculation unit is configured to obtain, as the attitude information, a roll angle which is a rotation angle around the X axis or a pitch angle which is a rotation angle around the Y axis, and
the range setting unit is configured to set, when the roll angle or the pitch angle exceeds a threshold value, a detection range of the X-axis angular velocity or the Y-axis angular velocity to be small.

8. The inertial sensor according to claim 1, wherein the first axis is an X axis or a Y axis,
the first physical quantity is an X-axis angular velocity which is an angular velocity around the X axis or a Y-axis angular velocity which is an angular velocity around the Y axis,
the second axis is a Z axis,
the second physical quantity is a Z-axis angular velocity which is an angular velocity around the Z axis, and
the range setting unit is configured to set, in an initial setting, a detection range of the Z-axis angular velocity to a magnitude equal to or smaller than a detection range of the X-axis angular velocity or the Y-axis angular velocity.

9. The inertial sensor according to claim 1, wherein the first axis is an X axis or a Y axis,
the first physical quantity is an X-axis acceleration which is an acceleration in an X-axis direction or a Y-axis acceleration which is an acceleration in a Y-axis direction,
the second axis is a Z axis,
the second physical quantity is a Z-axis acceleration which is an acceleration in a Z-axis direction, and
the range setting unit is configured to set, in an initial setting, a detection range of the Z-axis acceleration to a magnitude equal to or larger than a detection range of the X-axis acceleration or the Y-axis acceleration.

10. The inertial sensor according to claim 1, further comprising:
a third sensor configured to detect a third physical quantity on a third axis; and
a third detection circuit configured to perform the detection processing of the third physical quantity based on a third sensor signal from the third sensor, and output third detection information, wherein
the range setting unit is configured to perform the range setting processing of setting a detection range of the first physical quantity based on the first detection information, the second detection information, and the third detection information.

11. The inertial sensor according to claim 10, further comprising:
an attitude calculation unit configured to obtain attitude information of a measurement target based on the first detection information, the second detection information, and the third detection information, wherein the range setting unit is configured to perform the range setting processing based on the attitude information obtained by the attitude calculation unit.

12. The inertial sensor according to claim 1, wherein the range setting unit is configured to set, when a detection value of the first detection information exceeds a first threshold value in a first detection range while the first detection circuit is performing the detection processing of the first physical quantity in the first detection range, the detection range of the first physical quantity to a second detection range larger than the first detection range.

13. The inertial sensor according to claim 1, wherein the range setting unit is configured to:

maintain a first detection range for the first physical quantity when the second physical quantity does not exceed the threshold value; and switch to a second detection range for the first physical quantity when the second physical quantity exceeds the threshold value, wherein the second detection range is different from the first detection range.

14. The inertial sensor according to claim 1, wherein:

the second detection circuit is configured to compare the second sensor signal to the threshold value and generate the indication based on the comparison; and the range setting unit receives the indication from the second detection circuit and uses the indication as a trigger for adjusting the detection range of the first physical quantity.

15. The inertial sensor according to claim 1, wherein the detection range of the first physical quantity is adjusted based on a cross-axis relationship between the first axis and the second axis, such that detection characteristics on the second axis control the detection range on the first axis.

* * * * *